(12) United States Patent
Han et al.

(10) Patent No.: US 12,108,611 B2
(45) Date of Patent: Oct. 1, 2024

(54) NONVOLATILE MEMORY DEVICE HAVING RESISTANCE CHANGE LAYER

(71) Applicant: SK hynix Inc., Icheon-si (KR)

(72) Inventors: Jae Hyun Han, Icheon-si (KR); Se Ho Lee, Yongin-si (KR); Hyangkeun Yoo, Seongnam-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 16/941,170

(22) Filed: Jul. 28, 2020

(65) Prior Publication Data

US 2021/0257409 A1 Aug. 19, 2021

(30) Foreign Application Priority Data

Feb. 13, 2020 (KR) ........................ 10-2020-0017891

(51) Int. Cl.
*H10B 63/00* (2023.01)
*H10N 70/00* (2023.01)
*H10N 70/20* (2023.01)

(52) U.S. Cl.
CPC ............ *H10B 63/30* (2023.02); *H10B 63/82* (2023.02); *H10B 63/84* (2023.02); *H10N 70/24* (2023.02); *H10N 70/245* (2023.02); *H10N 70/253* (2023.02); *H10N 70/823* (2023.02); *H10N 70/841* (2023.02); *H10N 70/8822* (2023.02); *H10N 70/8828* (2023.02); *H10N 70/883* (2023.02); *H10N 70/8833* (2023.02); *H10N 70/8836* (2023.02)

(58) Field of Classification Search
CPC . H01L 27/2436; H01L 27/2472; H01L 45/08; H01L 45/085; H01L 45/12; H01L 45/1206; H01L 45/122; H01L 45/1226; H01L 45/1253; H10B 63/30; H10B 63/82; H10N 70/24; H10N 70/245; H10N 70/253; H10N 70/823; H10N 70/841; H10N 70/8822; H10N 70/8828; H10N 70/883; H10N 70/8833; H10N 70/8836
See application file for complete search history.

(56) References Cited

U.S. PATENT DOCUMENTS

| 9,076,723 | B1 | 7/2015 | Matsunami et al. | |
|---|---|---|---|---|
| 2010/0258778 | A1* | 10/2010 | Sung | H10N 70/826 257/43 |
| 2011/0001110 | A1* | 1/2011 | Takahashi | H01L 45/1633 257/E21.078 |
| 2015/0255511 | A1 | 9/2015 | Takagi et al. | |

(Continued)

FOREIGN PATENT DOCUMENTS

| CN | 113130739 A | 7/2021 |
|---|---|---|
| JP | 5488458 B2 | 5/2014 |

(Continued)

*Primary Examiner* — Herve-Louis Y Assouman
*Assistant Examiner* — Christopher M Roland

(57) ABSTRACT

A nonvolatile memory device according to an embodiment includes a substrate, a resistance change layer disposed on the substrate, a gate electrode layers disposed on the resistance change layer, and a first electrode pattern layer and a second electrode pattern layer that are disposed in the substrate and contact different portions of the resistance change layer. The resistance change layer includes movable oxygen vacancies or movable metal ions.

7 Claims, 31 Drawing Sheets

(56) References Cited

U.S. PATENT DOCUMENTS

| | | | | |
|---|---|---|---|---|
| 2017/0148982 | A1* | 5/2017 | Karpov | H01L 45/08 |
| 2018/0212144 | A1* | 7/2018 | Bushmaker | G11C 13/025 |
| 2019/0305046 | A1* | 10/2019 | Jha | G11C 11/54 |
| 2019/0305220 | A1 | 10/2019 | Jha et al. | |
| 2021/0193207 | A1* | 6/2021 | Mizusaki | G11C 13/0007 |
| 2021/0202835 | A1* | 7/2021 | Han | H01L 45/142 |

FOREIGN PATENT DOCUMENTS

| | | |
|---|---|---|
| KR | 20140127577 A | 11/2014 |
| KR | 20170106051 A | 9/2017 |
| KR | 20190008047 A | 1/2019 |

* cited by examiner

NONVOLATILE MEMORY DEVICE HAVING RESISTANCE CHANGE LAYER

CROSS-REFERENCE TO RELATED APPLICATIONS

The present application claims priority under 35 U.S.C. § 119(a) to Korean Application No. 10-2020-0017891, filed on Feb. 13, 2020, which is incorporated herein by reference in its entirety.

BACKGROUND

1. Technical Field

The present disclosure generally relates to a nonvolatile memory device and, more particularly, to a nonvolatile memory device having a resistance change layer and a method of operating the same.

2. Related Art

According to the trends of decreasing design rules and increasing degree of integration, research on the structures of semiconductor devices that can guarantee both structural stability and reliability of signal storage operation has continued. Currently, in a nonvolatile memory device such as a flash memory, a three-layer stack structure of a charge tunneling layer, a charge trap layer, and a charge barrier layer as a charge storage structure has been widely used.

Recently, various nonvolatile memory devices having different structures from traditional flash memory devices have been proposed.

An example of a nonvolatile memory device is a resistance change memory device. While the flash memory device implements a memory function through charge storing, the resistance change memory device variably changes the resistance state of a memory layer in a memory cell between a high resistance state and a low resistance state, and stores the changed resistance states in a nonvolatile manner, thereby writing predetermined signal information in the memory cell.

SUMMARY

A nonvolatile memory device according to an aspect of the present disclosure may include a substrate, a resistance change layer disposed on the substrate, a gate electrode layer disposed on the resistance change layer, and a first electrode pattern layer and a second electrode pattern layer that are disposed in the substrate and contact different portions of the resistance change layer. The resistance change layer may include movable oxygen vacancies or movable metal ions.

A nonvolatile memory device according to another aspect of the present disclosure may include a substrate and a gate structure disposed on the substrate. The gate structure may include at least one gate electrode layer and at least one interlayer insulation layers that are alternately stacked. The nonvolatile memory device may further include a hole pattern penetrating the gate structure on the substrate, a resistance change layer covering a sidewall surface of the gate structure in the hole pattern and including a variable resistance material, and a channel layer disposed in the hole pattern to cover the resistance change layer.

A nonvolatile memory device according to another aspect of the present disclosure may include a substrate, and a gate structure disposed on the substrate. The gate structure may include at least one gate electrode layer and at least one interlayer insulation layers that are alternately disposed in a first direction perpendicular to the substrate, and the gate structure may extend in a second direction perpendicular to the first direction. The nonvolatile memory device may further include a resistance change layer covering a sidewall surface of the gate structure disposed on the substrate and including a variable resistance material, and a channel layer disposed on the substrate and disposed to cover the resistance change layer.

Disclosed is a method of operating a nonvolatile memory device according to yet another aspect of the present disclosure. In the operation method, there may be provided a nonvolatile memory device including a substrate, a resistance change layer and a gate electrode layer sequentially disposed on the substrate, and a first electrode pattern layer and a second electrode pattern layer that are disposed in the substrate to contact different portions of the resistance change layer, the gate electrode layer including a plurality of gate pattern layers disposed to be spaced apart from each other between the first and second electrode pattern layers. A first gate voltage may be applied to the plurality of gate pattern layers to move oxygen vacancies or movable metal ions in the resistance change layer to a filament formation region of the resistance change layer and to form a conductive channel in the substrate. The first gate voltage applied to a target gate pattern layer among the plurality of gate pattern layers may be removed to disconnect the conductive channel while maintaining the first gate voltage to the plurality of gate pattern layers other than the target gate pattern layer. A set voltage may be applied between the first and second electrode pattern layers to form a conductive filament in the resistance change layer to electrically connect both ends of the disconnected conductive channel.

Disclosed is a method of operating a nonvolatile memory device according to still yet another aspect of the present disclosure. In the operation method, there may be provided a nonvolatile memory device including a substrate, a gate structure disposed on the substrate and having a plurality of gate electrode layers spaced apart from each other in a first direction perpendicular to the substrate, a resistance change layer covering a sidewall surface of the gate structure, a channel layer disposed to cover the resistance change layer, and a channel lower contact layer and a channel upper contact layer disposed at opposite ends of the channel layer. A first gate voltage may be applied to the plurality of gate electrode layers to move oxygen vacancies or movable metal ions in the resistance change layer to a region adjacent to the channel layer and to form a conductive channel in the channel layer. The first gate voltage applied to a target gate electrode layer among the plurality of gate electrode layers may be removed to disconnect the conductive channel while maintaining the first gate voltage to the plurality of gate electrode layers other than the target gate electrode layer. A set voltage may be applied between the channel lower contact layer and the channel upper contact layer to form a conductive filament in the resistance change layer to electrically connect both ends of the disconnected conductive channel.

DETAILED DESCRIPTION

Figure 1:
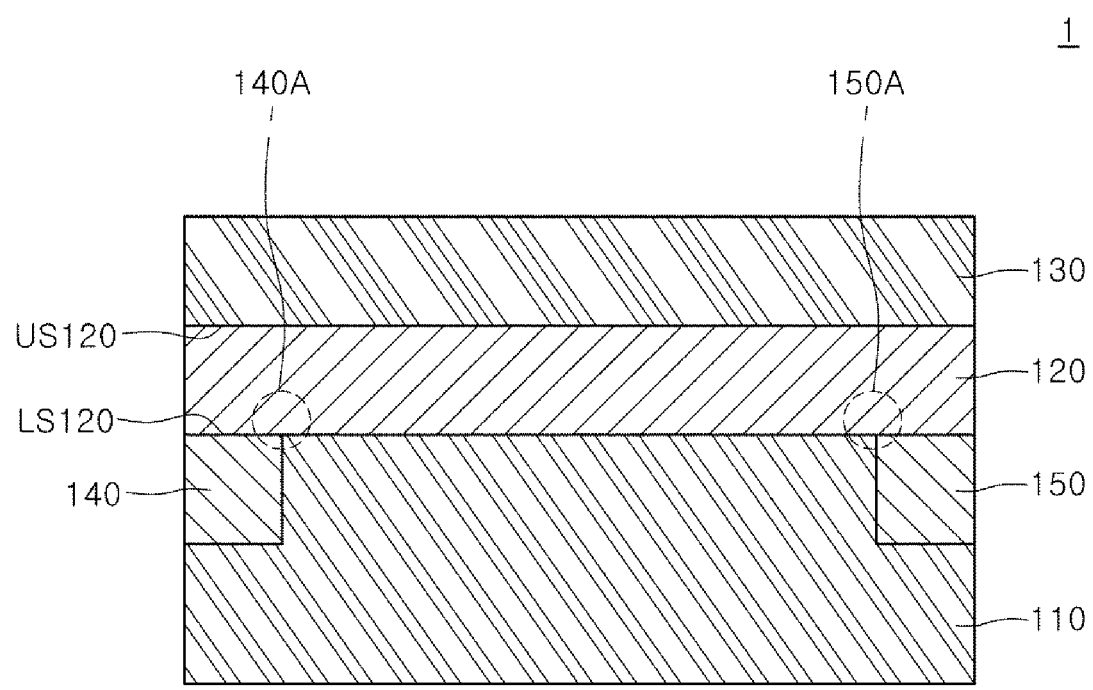
FIG. 1 is a cross-sectional view schematically illustrating a nonvolatile memory device according to an embodiment of the present disclosure.

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include', or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Further, in performing a method or a manufacturing method, each process constituting the method can take place differently from the stipulated order unless a specific sequence is described explicitly in the context. In other words, each process may be performed in the same manner as stated order, and may be performed substantially at the same time. Also, at least a part of each of the above processes may be performed in a reversed order.

In this specification, the term "a predetermined direction" may mean a direction encompassing one direction determined in a coordinate system and a direction opposite to that direction. As an example, in the x-y-z coordinate system, the x-direction may encompass a direction parallel to the x-direction. That is, the x-direction may mean all of a direction in which an absolute value of the x-axis increases in a positive direction along the x-axis from the origin 0 and a direction in which an absolute value of the x-axis increases in a negative direction along the x-axis from the origin 0. The y-direction and the z-direction may each be interpreted in substantially the same way in the x-y-z coordinate system FIG. 1 is a cross-sectional view schematically illustrating a nonvolatile memory device 1 according to an embodiment of the present disclosure. Referring to FIG. 1, the nonvolatile memory device 1 may include a substrate 110, a resistance change layer 120 disposed on the substrate 110, a gate electrode layer 130 disposed on the resistance change layer 120, and first electrode pattern layer 140 and second electrode pattern layer 150 that are disposed to contact to different portions of the resistance change layer 120 on the substrate 110.

Referring to FIG. 1, the substrate 110 may be provided. The substrate 110 may include a semiconductor material. Specifically, the semiconductor material may include silicon (Si), germanium (Ge), gallium arsenic (GaAs), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof.

The resistance change layer 120 may be disposed on the substrate 110. The resistance change layer 120 may have a first surface LS120 and a second surface US120 opposite to the first surface LS120. The first surface LS120 may interface with the substrate 110, and the second surface US 120 may interface with the gate electrode layer 130.

The resistance change layer 120 may include a variable resistance material. In a variable resistance material, an internal resistance state can be variably changed according to the polarity or magnitude of an applied voltage. In addition, the changed internal resistance state can be nonvolatilely stored in the variable resistance material after the applied voltage is removed. As an example, a high resistance state and a low resistance state, which are distinguished from each other, may be selectively stored in the variable resistance material. In other words, the variable resistance material may have a predetermined first resistance value corresponding to a high resistance state and a predetermined second resistance value corresponding to a low resistance state. The first resistance value and the second resistance value may be determined depending on the kind or nature of the variable resistance material.

In an embodiment, the variable resistance material may include movable oxygen vacancies or movable metal ions. The oxygen vacancies may have positive charge. The metal ions may be cations having positive charge or anions having negative charge. In an embodiment, the variable resistance material may include titanium oxide, aluminum oxide, nickel oxide, copper oxide, zirconium oxide, manganese oxide, hafnium oxide, tungsten oxide, tantalum oxide, niobium oxide, iron oxide, or a combination of two or more thereof. In another embodiment, the variable resistance material may include PCMO ($Pr_{1-x}Ca_xMnO_3$, 0<x<1), LCMO ($La_{1-x}Ca_xMnO_3$, 0<x<1), BSCFO ($Ba_{0.5}Sr_{0.5}Co_{0.8}Fe_{0.2}O_{3-\delta}$), YBCO ($YB_{a2}Cu_3O_{7-x}$, 0<x<1), (Ba, Sr)$TiO_3$ doped with chromium (Cr) or niobium (Nb), $SrZrO_3$ doped with chromium (Cr) or vanadium (V), (La, Sr)$MnO_3$, $Sr_{1-x}La_xTiO_3$ (0<x<1), $La_{1-x}Sr_xFeO_3$ (0<x<1), $La_{1-x}Sr_xCoO_3$ (0<x<1), $SrFeO_{2.7}$, $LaCoO_3$, $RuSr_2GdCu_2O_3$, $YB_{a2}Cu_3O_7$, or a combination of two or more thereof. In another embodiment, the variable resistance material may include germanium-antimony-tellurium (GST), arsenic-antimony-tellurium (As—Sb—Te), tin-antimony-tellurium (Sn—Sb—Te), tin-indium-antimony-tellurium (Sn—In—Sb—Te), arsenic-germanium-antimony-tellurium (As—Ge—Sb—Te), $GexSe_{1-x}$ (0<x<1), silver sulfide ($Ag_2S$), copper sulfide ($Cu_2S$), Cadmium sulfide (CdS), zinc sulfide (ZnS), and selenium oxide ($CeO_2$), or a combination of two or more thereof.

The gate electrode layer 130 may be disposed on the resistance change layer 120. The gate electrode layer 130 may be a pattern of a conductive thin film. The gate electrode layer 130 may include a conductive material. The conductive material may include, for example, a doped semiconductor material, metal, conductive metal nitride, conductive metal carbide, conductive metal silicide, or conductive metal oxide. The conductive material may include, for example, n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

Referring to FIG. 1, the first and second electrode pattern layers 140 and 150 may be spaced apart from each other in the substrate 110. The upper surfaces of the first and second electrode pattern layers 140 and 150 may be positioned at the same level as the upper surface of the substrate 110.

Each of the first and second electrode pattern layers 140 and 150 may include a conductive material. The conductive material may include, for example, a doped semiconductor material, metal, conductive metal nitride, conductive metal carbide, conductive metal silicide, or conductive metal oxide. The conductive material may include, for example, n-type doped silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

In an embodiment, the first and second electrode pattern layers 140 and 150 may be regions of the substrate 110. As an example, when the substrate 110 is a semiconductor substrate, the first and second electrode pattern layers 140 and 150 may be regions of the semiconductor substrate doped with an n-type dopant. In another embodiment, the first and second electrode pattern layers 140 and 150 may be formed of different materials. As an example, when the substrate 110 is a semiconductor substrate, the first and second electrode pattern layers 140 and 150 may be conductive material layers.

Meanwhile, the substrate 110 may further include a channel formation region (not illustrated) disposed between the first electrode pattern layer 140 and the second electrode pattern layer 150. The channel formation region may be a region in which a conductive channel 1000 is formed when a gate voltage equal to or higher than a predetermined threshold voltage is applied to the gate electrode layer 130, as will be described later with reference to FIG. 3.

Referring to FIG. 1 again, the first electrode pattern layer 140 may have a first pattern edge portion 140A positioned in a boundary region contacting the resistance channel layer 120 and the substrate 110. Similarly, the second electrode pattern layer 150 may include a second pattern edge portion 150A positioned in a boundary region contacting the resistance change layer 120 and the substrate 110. Although not illustrated in FIG. 1, the first and second pattern edge portions 140A and 150A may extend along the y-direction. When a voltage is applied between the first electrode pattern layer 140 and the second electrode pattern layer 150, an electric field generated by the voltage may be concentrated on the first and second pattern edge portions 140A and 150A.

Figure 2:
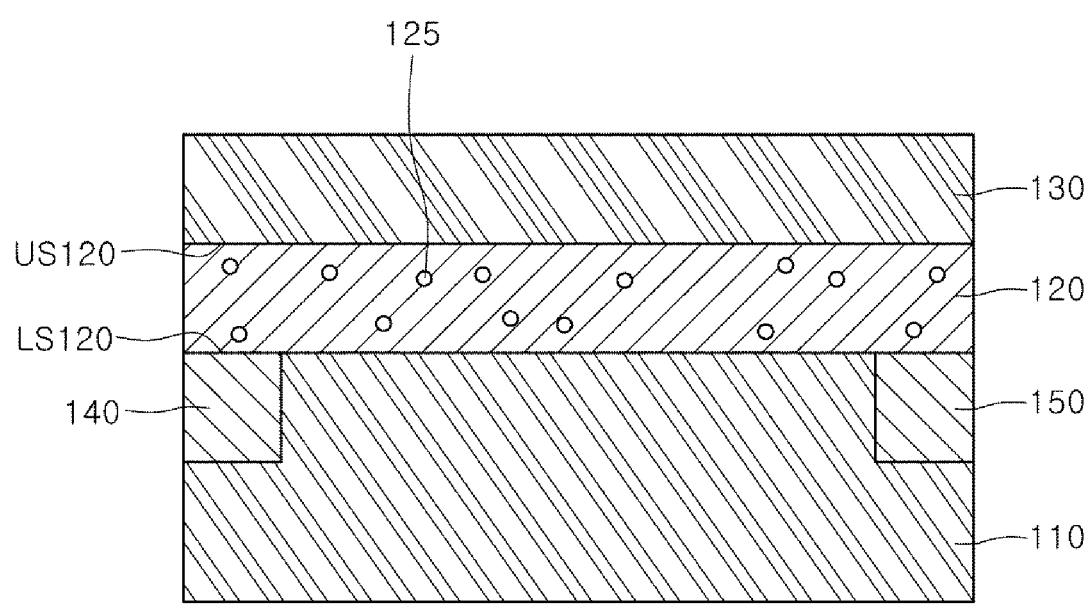
FIGS. 2 to 7 are views schematically illustrating methods of operating a nonvolatile memory device according to embodiments of the present disclosure.
Figure 3:
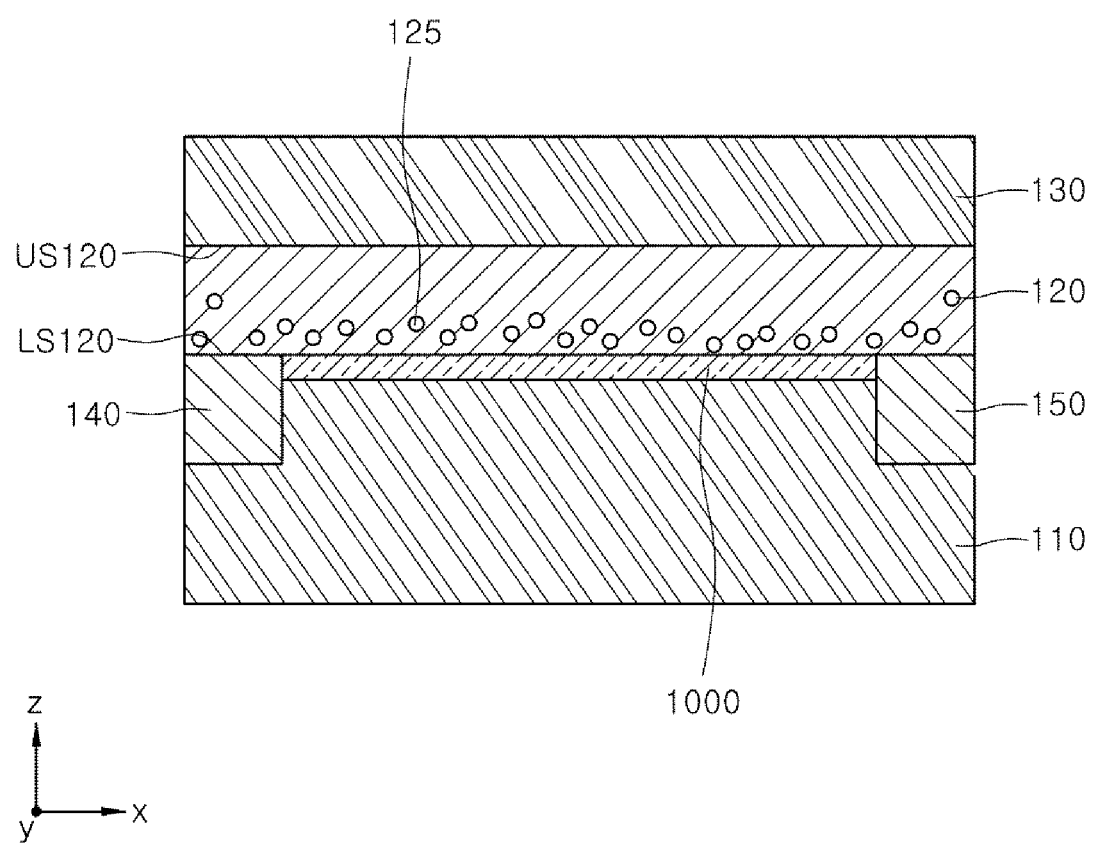
Figure 4:
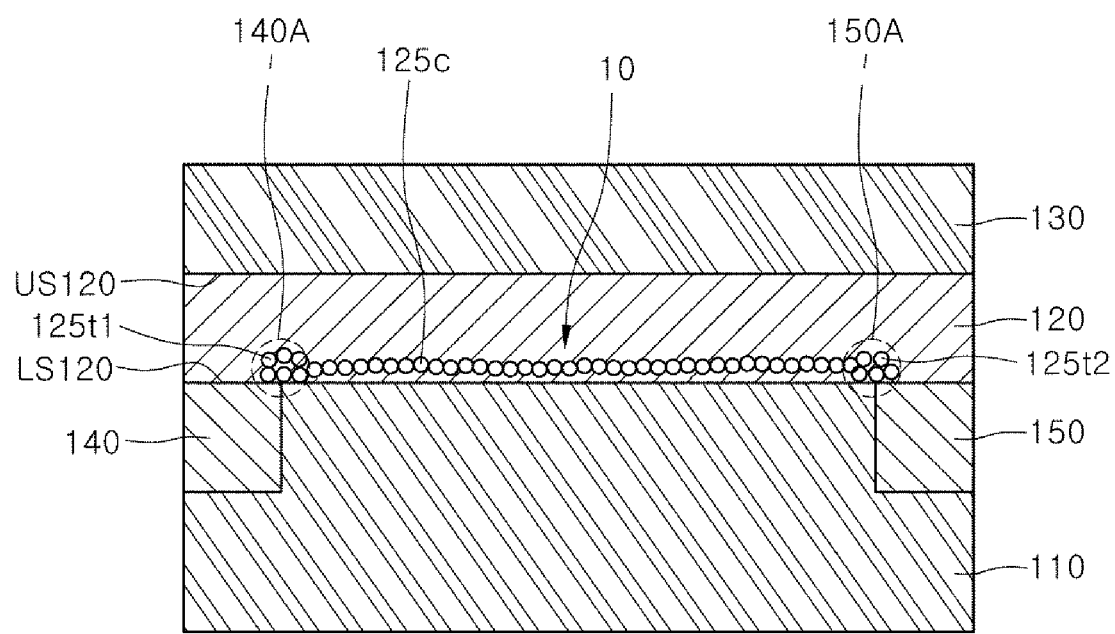
Figure 5:
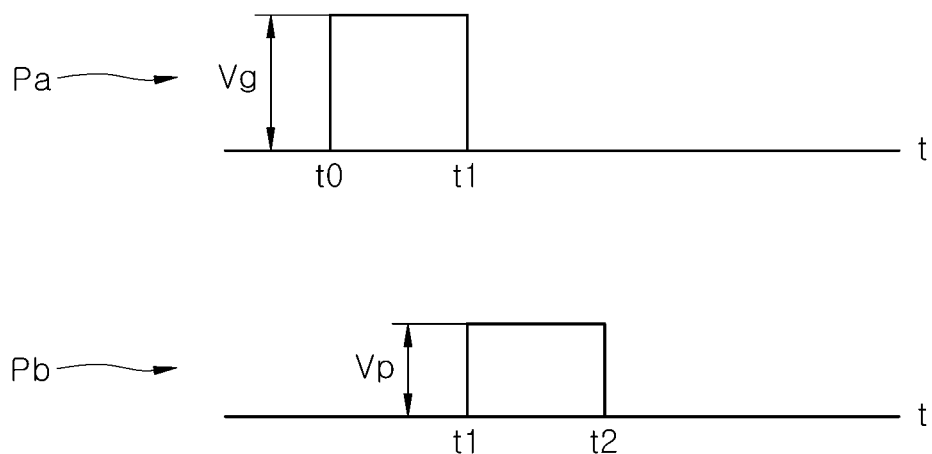
Figure 6:
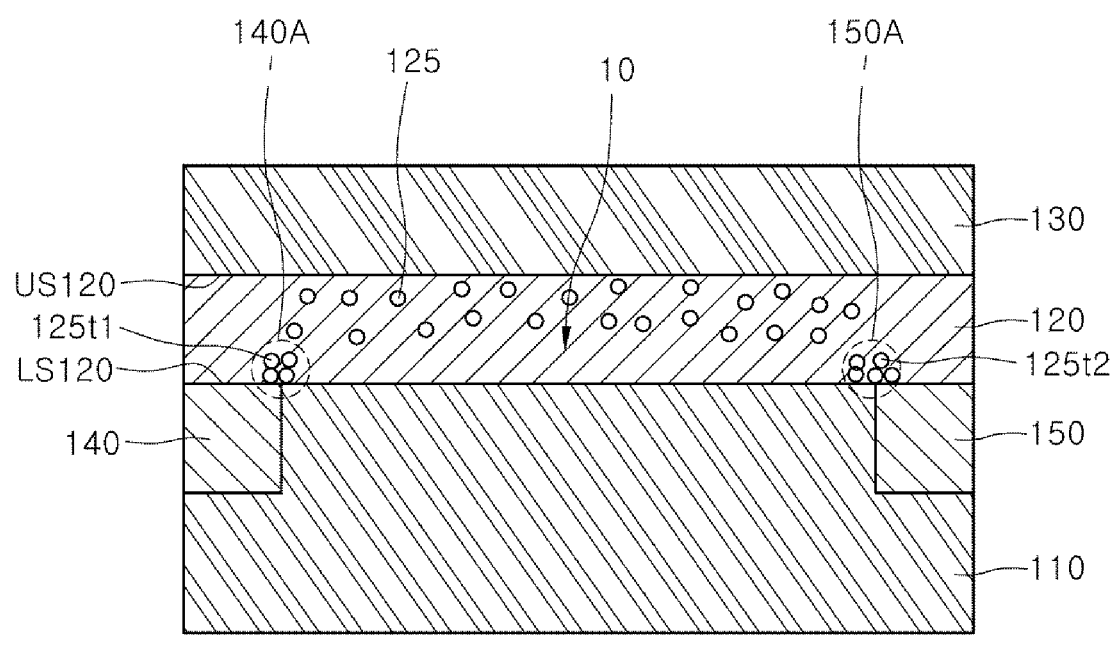
Figure 7:
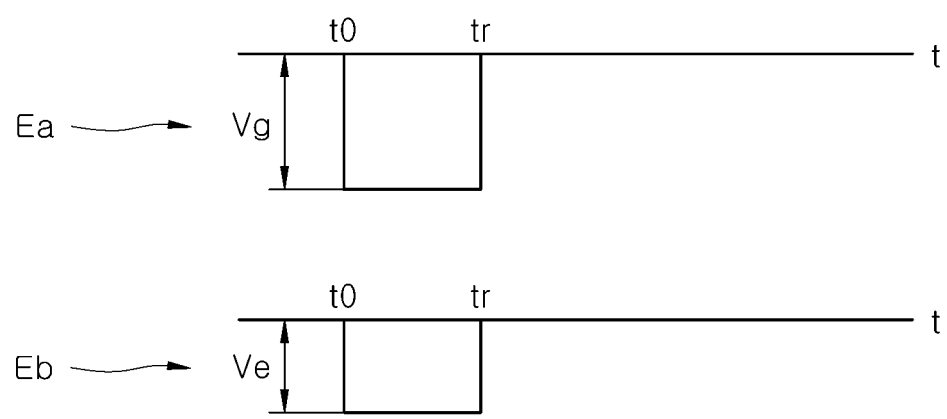

FIGS. 2 to 7 are views schematically illustrating methods of operating a nonvolatile memory device according to embodiments of the present disclosure. FIGS. 2 to 4 are views schematically illustrating a set operation of a nonvolatile memory device according to an embodiment of the present disclosure. FIG. 5 is a view schematically illustrating voltages applied during the set operation of a nonvolatile memory device according to an embodiment of the present disclosure. When a resistance change layer of the nonvolatile memory device has either a high resistance state or a low resistance state, the set operation may be an operation of converting the resistance state of the resistance change layer from the high resistance state to the low resistance state. FIG. 6 is a view schematically illustrating a reset operation of the nonvolatile memory device according to an embodiment of the present disclosure. FIG. 7 is a view schematically illustrating voltages applied during the reset operation of a nonvolatile memory device according to an embodiment of the present disclosure. The reset operation may be an operation of converting the resistance state of the resistance change layer from the low resistance state to the high resistance state. The operating methods of the nonvolatile memory device to be described with reference to FIGS. 2 to 7 will be described with reference to nonvolatile memory device 1 described above and in FIG. 1.

Referring to FIG. 2, the nonvolatile memory device 1 described above with reference to FIG. 1 may be provided. A resistance change layer 120 may have movable oxygen vacancies or movable metal ions 125. In an embodiment, the movable oxygen vacancies or movable metal ions 125 may be uniformly distributed inside the resistance change layer 120. Hereinafter, an embodiment in which the resistance change layer 120 is provided with oxygen vacancies 125 having positive charge will be described. In another embodiment, substantially the same operation methods may be used when the resistance change layer 120 includes movable metal ions 125.

Referring to FIG. 3, a first gate voltage may be applied to a gate electrode layer 130. The first gate voltage may include a bias of a positive polarity. The oxygen vacancies 125 may move to a filament formation region adjacent to the first surface LS120 due to the first gate voltage. The filament formation region may be a region of the resistance change layer 120 in which a conductive filament (10 of FIG. 4) is generated. In some embodiments, a conductive channel 1000 may be formed in the region of the substrate 110 near the contact with the resistance change layer 120 as a result of applying the first gate voltage.

According to an embodiment, the concentration of the oxygen vacancies 125 moving to the filament formation region can be controlled by controlling the magnitude of the first gate voltage. The concentration of the oxygen vacancies 125 may determine the diameter of the conductive filament formed, as described below.

Referring to FIG. 4, the first gate voltage applied to the gate electrode layer 130 may be removed, and a set voltage may be applied between the first electrode pattern layer 140 and the second electrode pattern layer 150. As a result, an electric field resulting from the set voltage may be formed inside the resistance change layer 120, and the conductive filament 10 electrically connecting the first electrode pattern layer 140 and the second electrode pattern layer 150 may be formed in the resistance change layer 120.

Referring to FIG. 5, along the time axis t, the first gate voltage, which is a pulse voltage Pa having a first amplitude Vg, may be applied between the initial time t0 and the first time t1. Subsequently, a set voltage, which is a pulse voltage Pb having a second amplitude Vp, may be applied between the first time t1 and the second time t2. That is, at the first time t1, the first gate voltage may be removed and the set voltage may be applied at or substantially at the same time. The shapes of the amplitude Vg of the pulse voltage Pa and the time interval between the initial time t0 and the first time t1 shown in FIG. are only examples, and various modifications are possible depending on the physical properties of the thin films used in the structure of the nonvolatile memory device 1 and the electrical characteristics of the device implemented through the thin film. In addition, the shapes of the amplitude Vp of the pulse voltage Pb and the time interval between the first time t1 and the second time t2 are only examples, and various modifications are possible.

Referring to FIG. 4 again, when the set voltage is applied, the electric field may be concentrated on the first and second pattern edge portions 140A and 150A of the first and second electrode pattern layers 140 and 150, respectively. Accordingly, oxygen vacancies 125 may be more actively aggregated or bound to each other in regions of the resistance change layer 120 adjacent to the first and second pattern edge portions 140A and 150A, so that first and second trigger filaments 125t1 and 125t2 may be formed. The first and second trigger filaments 125t1 and 125t2 may be formed to contact the first and second electrode pattern layers 140 and 150. Each of the first and second trigger filaments 125t1 and 125t2 may be a starting position or seed from which the conductive filament 10 is generated. In addition, the first and second trigger filaments 125t1 and 125t2 are stably formed on the pattern edge portions 140A and 150A, so that errors in the set operation of the nonvolatile memory device 1 to be described later can be prevented. That is, the first and second trigger filaments 125t1 and 125t2 structurally stabilize the connection or short circuit state of the conductive filaments 10 in the first and second pattern edge portions 140A and 150A, thereby improving the retention and endurance of signal information.

In addition, the oxygen vacancies 125 may be aggregated or bound to the first and second trigger filaments 125t1 and 125t2, so that the connecting filaments 125c can grow from the first and second trigger filaments 125t1 and 125t2. The connecting filament 125c may connect the first and second trigger filaments 125t1 and 125t2 to form the conductive filament 10. The conductive filament 10 electrically connects the first electrode pattern layer 140 and the second electrode pattern layer 150 so that the electrical resistance of the resistance change layer 120 can be reduced. The conductive filament 10 remains inside the resistance change layer 120 even after the set voltage and the gate voltage are removed, so that the resistance change layer 120 can maintain the reduced electrical resistance. That is, the resistance change layer 120 can in effect store a low resistance state as signal information.

In an embodiment, because the concentration of the aggregated or bound oxygen vacancies in the first and second pattern edge portions 140A and 150A is higher due to the electric field concentrated in those areas, the diameters of the first and second trigger filaments 125t1 and 125t2 may be greater than the diameter of the connecting filament 125c.

In some embodiments, the concentration of the oxygen vacancies 125 induced into the filament formation region by the first gate voltage may determine the diameter of the conductive filament 10. As the concentration of the induced oxygen vacancies 125 increases, the number of the oxygen vacancies 125 aggregated or bound by the set voltage may increase. Accordingly, the diameter of the conductive filament 10 formed by the set voltage can be increased. In addition, as the diameter of the conductive filament 10 increases, the resistance value of the resistance change layer 120 can be decreased. As described above, a plurality of resistance values can be written in the resistance change layer 120 according to the resistance values of the resistance change layer 120 that change according to the diameter of the conductive filament 10. As a result, a nonvolatile memory device that stores a plurality of pieces of signal information in the resistance change layer 120 can be implemented.

FIGS. 6 and 7 schematically illustrate a reset operation according to another embodiment of the present disclosure. A second gate voltage may be applied to the gate electrode layer 130. The second gate voltage may include a bias of a negative polarity. In addition, while applying the second gate voltage, a reset voltage may be applied between the first electrode pattern layer 140 and the second electrode pattern layer 150. The reset voltage may have a different polarity from the set voltage.

Referring to FIG. 7, along the time axis t, the second gate voltage, which is a negative pulse voltage Ea having a first amplitude Vg, may be applied between the initial time t0 and the reset time tr. During the same time period, the reset voltage, which is a negative pulse voltage Eb having a second amplitude Ve, may be applied.

Referring to FIG. 6 again, the energy supplied by the reset voltage decomposes the conductive filament 10. As an example, the energy may be electrical energy or thermal energy formed by an electric field. Oxygen vacancies 125 may be discharged from the conductive filament 10 and then distributed in the resistance change layer 120. In addition, under the attraction force generated by the second gate voltage, the oxygen vacancies 125 may be expelled from the filament formation region. That is, the oxygen vacancies 125 may move away from a region of the resistance change layer 120 adjacent to the first surface LS120. For example, oxygen vacancies 125 may move from the filament formation region near first surface LS120 to a region of the resistance change layer 120 adjacent to the second surface US120.

In an embodiment, the degree of decomposition of the conductive filament 10 caused by the reset voltage may be greater in the connecting filament 125c having a relatively low concentration of the aggregated or bound oxygen vacancies. Accordingly, the portions of the first and second trigger filaments 125t1 and 125t2 having relatively higher concentrations of the aggregated or bound oxygen vacancies may be less degraded and remain in the pattern edge portions 140A and 150A of the first and second electrode pattern layers 140 and 150.

The decomposition may continue until at least a portion of the conductive filament 10 is disconnected, so that the electrical resistance of the resistance change layer 120 may be increased. Accordingly, the internal resistance state of the resistance change layer 120 may be changed from a low resistance state to a high resistance state. The disconnection state of the conductive filament 10 remains even after the second gate voltage and the reset voltage are removed, so that the resistance change layer 120 can maintain the high resistance state. That is, the resistance change layer 120 can store the high resistance state as signal information.

The shapes of the amplitude Vg of the pulse voltage Ea and the time interval between the initial time t0 and the reset time tr shown in FIG. 7 are only examples, and various modifications are possible depending on the physical properties of the thin films used in the structure of the nonvolatile memory device 1 and the electrical characteristics of the device implemented through the nonvolatile memory device. In addition, the shapes of the amplitude Ve of the pulse voltage Eb and the time interval between the initial time t0 and the reset time tr is also only an example, and various modifications are possible.

In a read operation of the nonvolatile memory device 1, a read voltage may be applied between the first and second electrode pattern layers 140 and 150. During the operation, no voltage is applied to the gate electrode layer 130, or a third gate voltage with a magnitude less than a threshold voltage capable of forming the conductive channel 1000 is applied to the gate electrode layer 130. Then, the current flowing between the first and second electrode pattern layers 140 and 150 due to the applied read voltage may be measured. The magnitude of the read voltage may be selected to that the conductive filament 10 does not form inside the resistance change layer 120 and the conductive filament 10 does not decompose.

When the conductive filament 10 is formed inside the resistance change layer 120 between the first and second electrode pattern layers 140 and 150, a relatively high current may be measured through the conductive filament 10. Conversely, when the conductive filament 10 is not formed, or is disconnected, inside the resistance change layer 120 between the first and second electrode pattern layers 140 and 150, a relatively low current may be measured. In this manner, signal information stored in the resistance change layer 120 of the nonvolatile memory device 1 can be read.

According to an embodiment of the present disclosure described above, when a set operation is performed on the nonvolatile memory device 1, the first and second trigger filaments 125t1 and 125t2 can be formed in the resistance change layer 120 adjacent to the first and second pattern edge portions 140A and 150A, which are portions where the electric field is concentrated. Then, the connecting filament 125c is formed to connect the first and second trigger filaments 125t1 and 125t2 so that the conductive filament 10 can be completed. As a result, by controlling the positions of the first and second trigger filaments 125t1 and 125t2, from which the connecting filament is generated, the density and distribution of the conductive filaments 10 can be effectively limited or controlled.

In some embodiments, the conductive filament 10 of the nonvolatile memory device may be formed by movable metal ions 125 distributed in the resistance change layer 120. In an embodiment, when the resistance change layer 120 includes positive metal ions 125, the conductive filament generation or decomposition of the conductive filament 10 in the resistance change layer 120 may be produced by the same operations as the set operation described above with reference to FIGS. 2 to 5 and the reset operation described with reference to FIGS. 6 and 7.

In another embodiment, when the resistance change layer 120 includes negative metal ions 125, a first gate voltage including a bias of a negative polarity may be applied to the gate electrode layer 130. Accordingly, the negative metal ions 125 may move to the filament formation region of the resistance change layer 120 adjacent to the first surface LS120. Subsequently, the first gate voltage may be removed, and a set voltage may be applied between the first and second electrode pattern layers 140 and 150 to form a conductive filament 10 in the resistance change layer 120. The set voltage in this embodiment may have a different polarity from the set voltage of the embodiment described above in connection with FIGS. 2 to 5.

In a reset process, a second gate voltage including a bias of a positive polarity may be applied to the gate electrode layer 130 and a reset voltage may be applied between the first and second electrode pattern layers 140 and 150. The reset voltage in this embodiment may have a different polarity from the reset voltage of the embodiment described above in connection with FIGS. 6 and 7. Accordingly, the negative metal ions 125 that result from decomposition of the conductive filament as a result of the reset voltage can be effectively expelled from the filament formation region.

Figure 8:
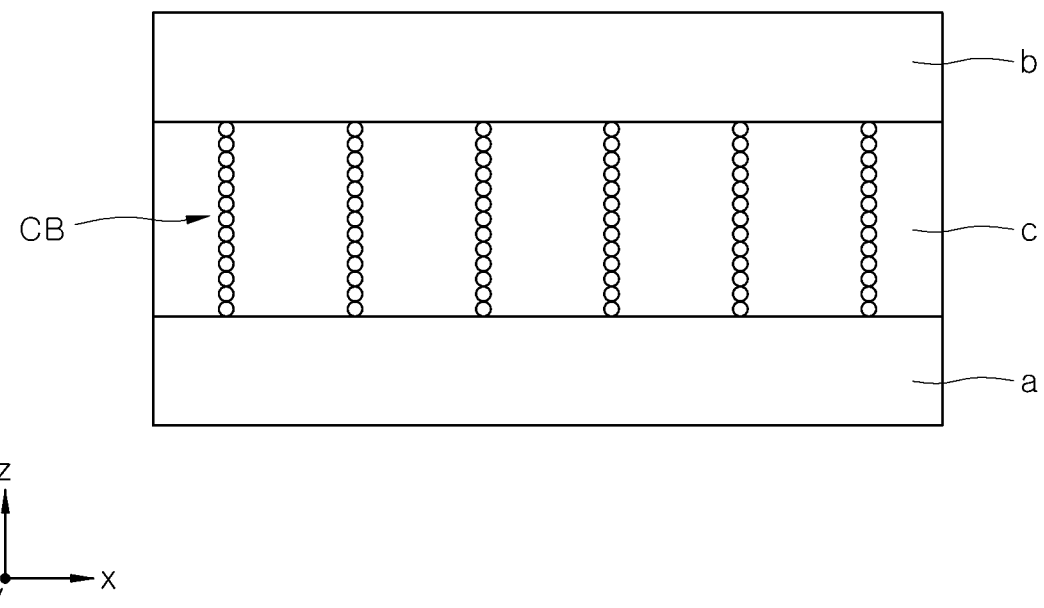
FIG. 8 is a cross-sectional view of a nonvolatile memory device having a resistance change layer according to a comparative example.

FIG. 8 is a cross-sectional view of a nonvolatile memory device having a resistance change layer according to a comparative example. Referring to FIG. 8, a nonvolatile memory device 1A may include first and second electrode layers a and b that face each and are spaced apart in the z-direction. The nonvolatile memory device 1A may include a resistance change layer c disposed between the first and second electrode layers a and b. Because the first electrode layer a and the second electrode layer b are disposed to face each other in the z-direction, a plurality of conductive filaments CB may be randomly grow between the interface of the resistance change layer c with the first electrode layer a or with the second electrode layer b when a set voltage is applied. That is, in the comparative example, it may be relatively difficult to control the density and distribution of the conductive filaments CB. In contrast, in embodiments of the present disclosure, the first and second electrode pattern layers 140 and 150 do not face each other. In addition, in the embodiment of the present disclosure, the first and second trigger filaments 125t1 and 125t2 formed on the first and second pattern edge portions 140A and 150A may determine a starting position of the conductive filament 10. Accordingly, the density and distribution of the conductive filaments can be effectively controlled.

Figure 9:
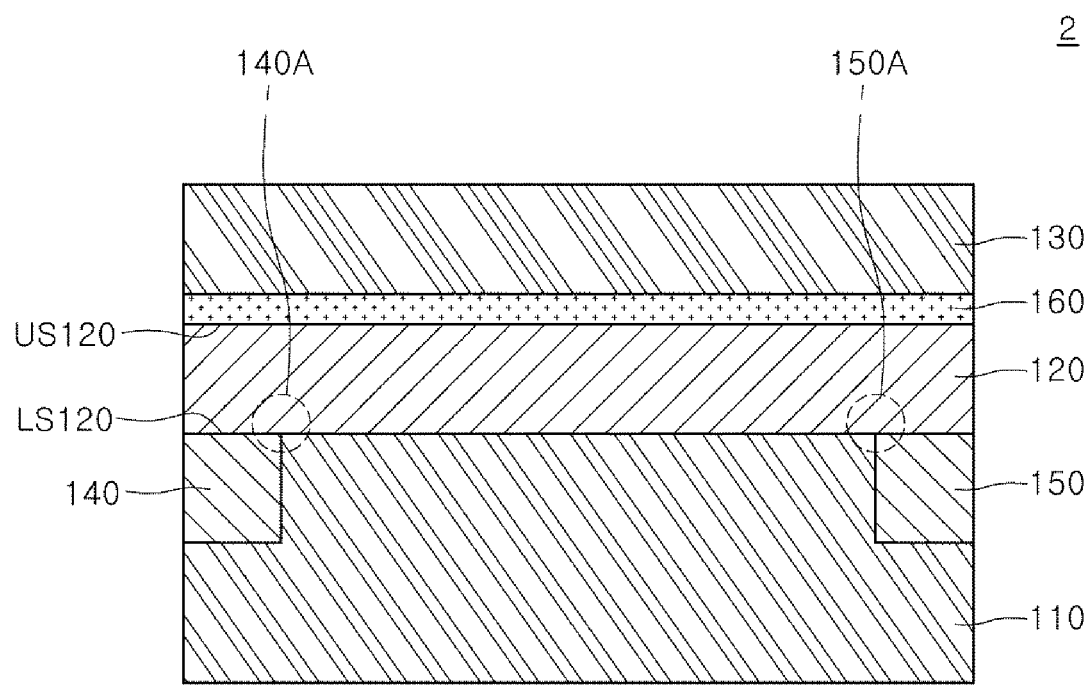
FIG. 9 is a cross-sectional view schematically illustrating a nonvolatile memory device according to another embodiment of the present disclosure.

FIG. 9 is a cross-sectional view schematically illustrating a nonvolatile memory device according to another embodiment of the present disclosure. Referring to FIG. 9, a nonvolatile memory device 2 may further include a gate insulation layer 160 as compared with the nonvolatile memory device 1 described above with reference to FIG. 1.

The gate insulation layer 160 may be disposed between a resistance change layer 120 and a gate electrode layer 130.

The gate insulation layer 160 can prevent oxygen vacancies or movable metal ions inside the resistance change layer 120 from moving to the gate electrode layer 130 during the operation of the nonvolatile memory device 2. In some cases, it is possible to suppress the formation of parasitic filaments that electrically connect the gate electrode layer 130 and the first electrode pattern 140 or that electrically connect the gate electrode layer 130 and the second electrode pattern layer 150. The gate insulation layer 160 may include an insulating material. The gate insulation layer 160 may include, for example, silicon oxide, silicon nitride, silicon oxynitride, aluminum oxide, hafnium oxide, and the like.

Figure 10:
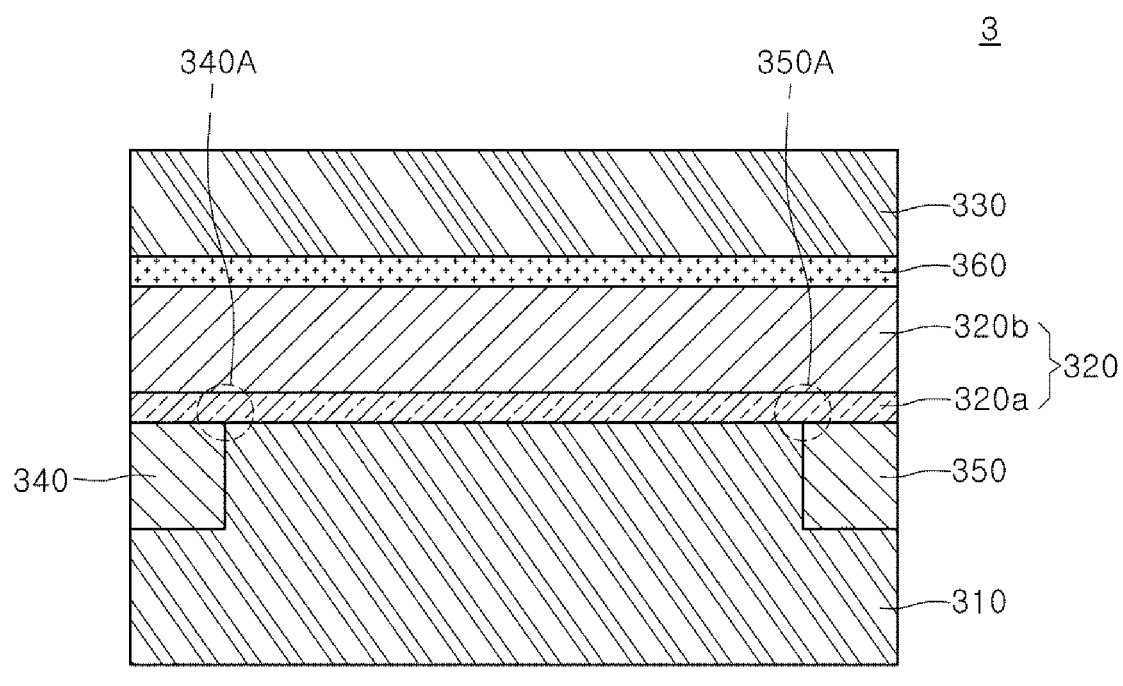
FIG. 10 is a cross-sectional view schematically illustrating a nonvolatile memory device according to another embodiment of the present disclosure.

FIG. 10 is a cross-sectional view schematically illustrating a nonvolatile memory device according to another embodiment of the present disclosure. Referring to FIG. 10, a nonvolatile memory device 3 may be different from the nonvolatile memory device 2 described above with reference to FIG. 9 with respect to the configuration of a resistance change layer 320. The configurations of a substrate 310, a gate electrode layer 330, first and second electrode pattern layers 340 and 350, first and second pattern edge portions 340A and 350A, and a gate insulation layer 360 of the nonvolatile memory device 3 may be substantially the same as the configurations of the substrate 110, the gate electrode layer 130, the first and second electrode pattern layers 140 and 150, the first and second pattern edge portions 140A and 150A, and the gate insulation layer 160 of the nonvolatile memory device 2 described above with reference to FIG. 9.

In an embodiment, the resistance change layer 320 may include first and second resistive material layers 320a and 320b that are sequentially disposed on the first and second electrode pattern layers 340 and 350 and the substrate 310. The first resistive material layer 320a may contact the first and second electrode pattern layers 340 and 350 and the substrate 310, and the second resistive material layer 320b may contact the first resistive material layer 320a and gate insulation layer 360.

Each of the first and second resistive material layers 320a and 320b may include a variable resistance material. The variable resistance material may include movable oxygen vacancies or movable metal ions. The metal ions may be positive ions or negative ions. The variable resistance material may be substantially the same as the variable resistance material of the resistance change layer 120 of the nonvolatile memory device 1 described above with reference to FIG. 1.

The first and second resistive material layers 320a and 320b may differ from each other. For example, the first and second resistive material layers 320a and 320b may include different variable resistance materials. The first resistive material layer 320a may have a lower concentration of oxygen vacancies or a lower concentration of movable metal ions than the second resistive material layer 320b. The first resistive material layer 320a may be a higher resistive body than the second resistive material layer 320b. In addition, the thickness of the first resistive material layer 320a may be less than the thickness of the second resistive material layer 320b.

Figure 11:
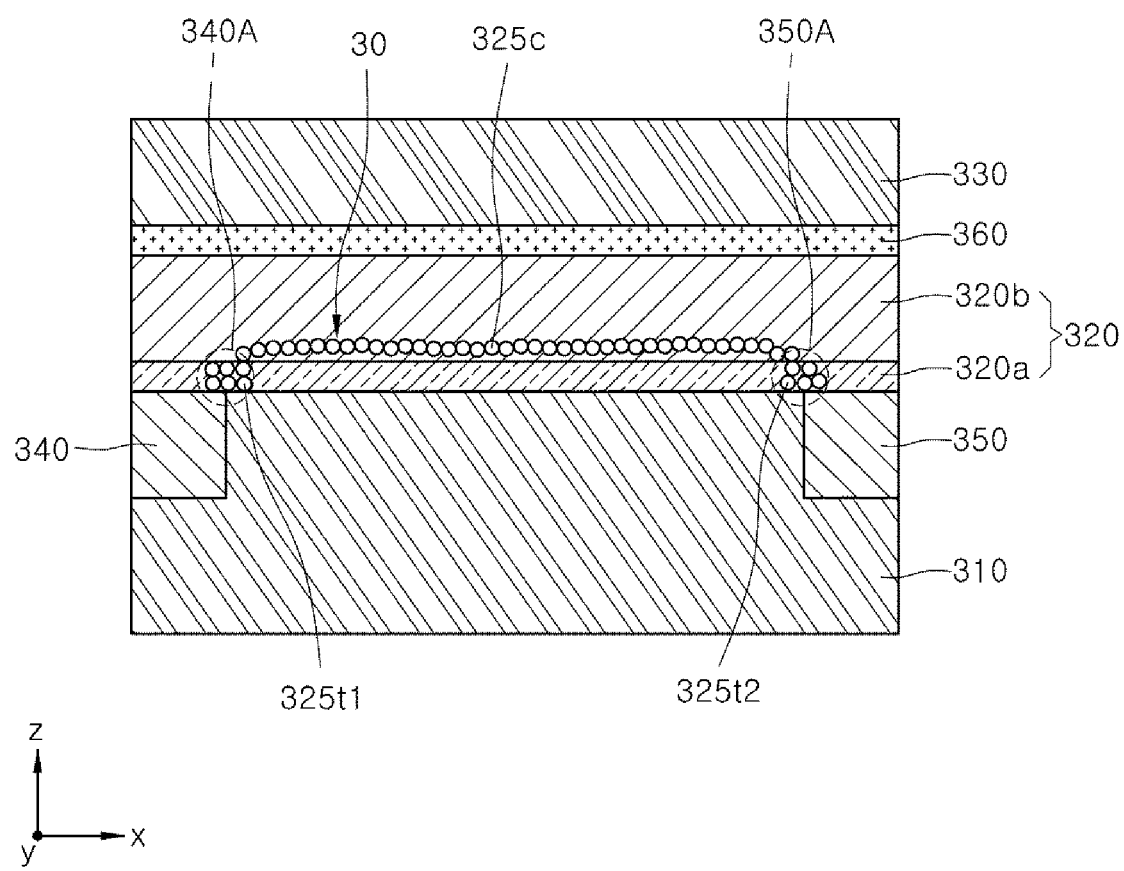
FIGS. 11 and 12 are views schematically illustrating a set operation and a reset operation of a nonvolatile memory device according to an embodiment of the present disclosure.
Figure 12:
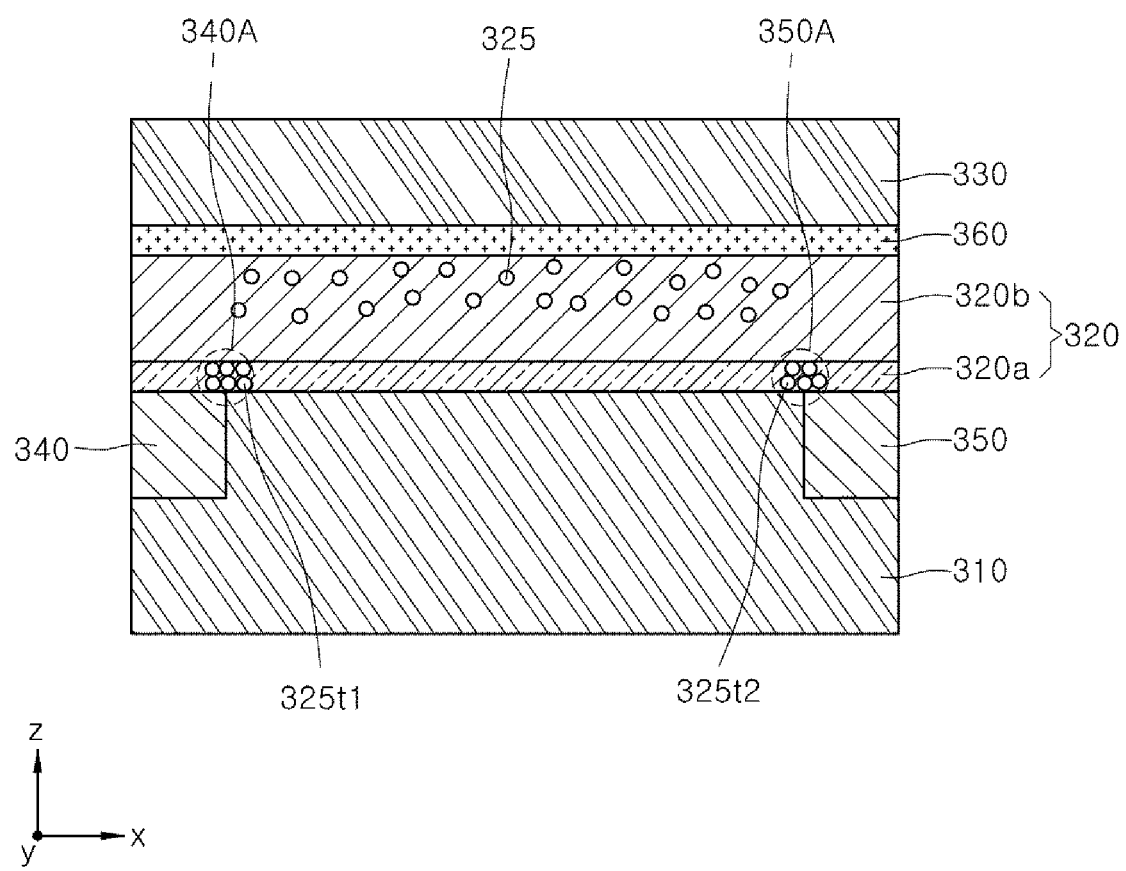

FIGS. 11 and 12 are views respectively illustrating a set operation and a reset operation of a nonvolatile memory device according to an embodiment of the present disclosure. Specifically, the set operation and the reset operation in connection with FIGS. 11 and 12 will be described with reference to the nonvolatile memory device 3 of FIG. 10 as an example. Hereinafter, for the convenience of explanation, an embodiment in which the resistance change layer 320 is provided with oxygen vacancies having positive charges will be described, but embodiments are not limited thereto, and the present disclosure encompasses resistance change layers that may include movable metal ions having positive or negative charges. If the resistance change layer 320 includes movable metal ions having negative charges, then the disclosed operations can be substantially the same, except for differences between the polarities of the first and second gate voltages, and between the polarities of the set voltage and the reset voltage.

Referring to FIG. 11, for the set operation, a first gate voltage having a positive polarity may be applied to a gate electrode layer 330, and the oxygen vacancies in the first and second resistive material layers 320a and 320b may move toward the substrate 310. Subsequently, the first gate voltage applied to the gate electrode layer 330 may be removed, and a set voltage equal to or higher than a predetermined threshold voltage may be applied between the first and second electrode pattern layers 340 and 350. Accordingly, an electric field resulting from the set voltage may be formed inside the resistance change layer 320.

The electric field generated by the set voltage may be concentrated on the pattern edge portions 340A and 350A of the first and second electrode pattern layers 340 and 350, respectively. If the first resistive material layer 320a is a higher resistive body than the second resistive material layer 320b, then when the set voltage is applied across the first resistive material layer 320a and the second resistive material layer 320b, between the first and second electrode pattern layers 340 and 350, a relatively greater voltage may be applied to the first resistive material layer 320a. As a result, first and second trigger filaments 325t1 and 325t2 may be formed in the first resistive material layer 320a adjacent to the pattern edge portions 350A and 360A, respectively.

The first and second trigger filaments 325t1 and 325t2 may be formed to contact the first and second electrode pattern layers 340 and 350, respectively. In addition, a connecting filament 325c connected to the first and second trigger filaments 325t1 and 325t2 may be formed in the second resistive material layer 320b. The connecting filament 325c connects the first and second trigger filaments 325t1 and 325t2 to form a conductive filament 30.

Referring to FIG. 12, for the reset operation, a second gate voltage including a bias of a negative polarity may be applied to the gate electrode layer 330. Further, while applying the second gate voltage, a reset voltage equal to or greater than a predetermined threshold voltage may be applied between the first and second electrode pattern layers 340 and 350. The reset voltage may have a different polarity from the set voltage.

According to an embodiment, the conductive filament 30 may decompose due to the Joule heat generated by the reset voltage. As a result of the decomposition, the oxygen vacancies 325 may be discharged from the conductive filament 30, and then distributed in the resistance change layer 320. The discharge of the oxygen vacancies 325 may occur at a relatively higher frequency in the connecting filament 325c of the second resistive material layer 320b. In addition, the discharged oxygen vacancies 325 may be expelled from the filament formation region as a result of the second gate voltage. As the oxygen vacancies 325 are discharged, at least a portion of the conductive filament 30 may be disconnected. As a result, the electrical resistance of the resistance change layer 320 may increase. Accordingly, the internal resistance state of the resistance change layer 320 may be converted from a low resistance state to a high resistance state.

According to the present embodiment, the resistance change layer 320 may include the first resistive material layer 320a and the second resistive material layer 320b. The first resistive material layer 320a may be a high resistive body having a relatively low concentration of oxygen vacancies, and the second resistive material layer 320b may be a low resistive body having a relatively high concentration of oxygen vacancies. Accordingly, when the oxygen vacancies inside the first and second resistive material layers 320a and 320b move toward the substrate 310 under the first gate voltage, the frequency of recombination of the oxygen vacancies and electrons in the conductive channel at the interface between the first resistive material layer 320a and the substrate 310 may be reduced at least in part because the first resistive material layer 320a contains fewer oxygen vacancies. That is, it is possible to prevent an undesired charge flow due to the recombination of electrons and vacancies between the first resistive material layer 320a and the substrate 310. In addition, when the set voltage is applied, the electric field is more concentrated on the first resistive material layer 320a adjacent to the pattern edge portions 340A and 340B, thereby promoting the generation of the first and second trigger filaments 325t1 and 325t2.

Figure 13:
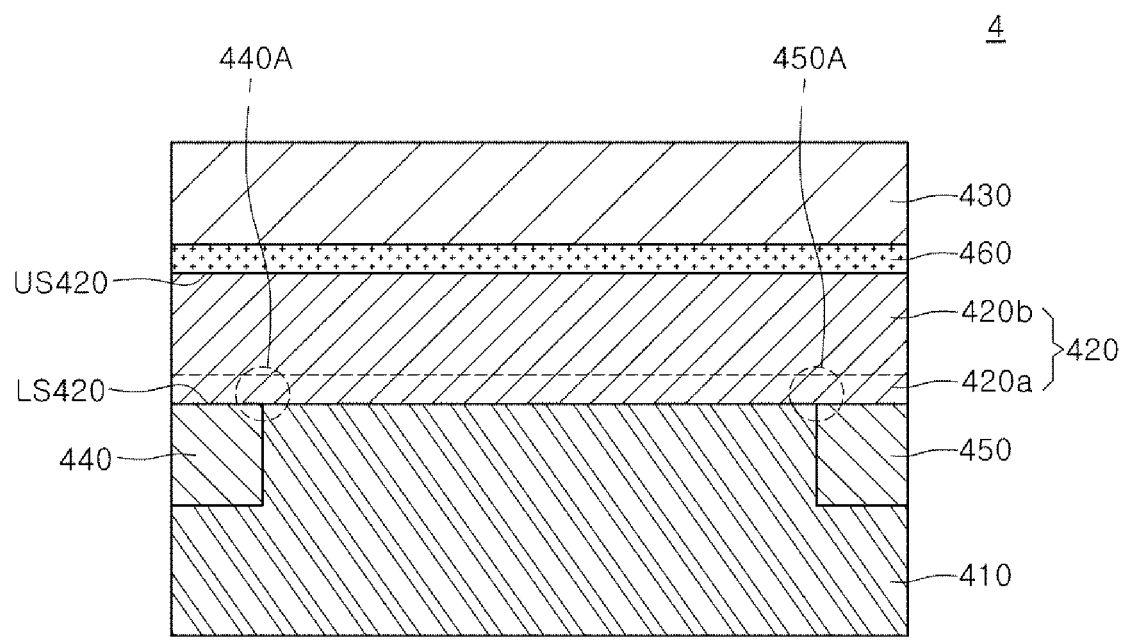
FIG. 13 is a cross-sectional view schematically illustrating a nonvolatile memory device according to another embodiment of the present disclosure.

FIG. 13 is a cross-sectional view schematically illustrating a nonvolatile memory device according to another embodiment of the present disclosure. Referring to FIG. 13, the nonvolatile memory device 4 may have a configuration substantially the same as the configuration of the nonvolatile memory device 3 described above with reference to FIG. 10, except for a resistance change layer 420. That is, the configurations of a substrate 410, a gate electrode layer 430, first and second electrode pattern layers 440 and 450, first and second pattern edge portions 440A and 450A, and a gate insulation layer 460 may be substantially the same as the configurations of the substrate 310, the gate electrode layer 330, the first and second electrode pattern layers 340 and 350, the first and second pattern edge portions 340A and 350A, and the gate insulation layer 360 described above with reference to FIG. 12.

In an embodiment, the resistance change layer 420 may include first and second resistive material layers 420a and 420b sequentially disposed on the first and second electrode pattern layers 440 and 450 and the substrate 410. That is, the first resistive material layer 420a may contact and be disposed on the first and second electrode pattern layers 440 and 450 and the substrate 410. The second resistive material layer 420b may contact and be disposed on the gate insulation layer 460.

Each of the first and second resistive material layers 420a and 420b may include a variable resistance material. The variable resistance material may have movable oxygen vacancies or movable metal ions. The metal ion may be a positive ion or a negative ion. The variable resistance material may be substantially the same as the variable resistance material constituting the resistance change layer 120 of the nonvolatile memory device 1 described above with reference FIG. 1.

In an embodiment, the first and second resistive material layers 420a and 420b may include the same variable resistance material, however, the first and second resistive material layers 320a and 320b may differ from each other in other ways. For example, the first resistive material layer 420a may have a lower concentration of oxygen vacancies or a lower concentration of movable metal ions than the second resistive material layer 420b. The first resistive material layer 420a may be a higher resistive body than the second resistive material layer 420b. Also, the thickness of the first resistive material layer 420a may be less than the thickness of the second resistive material layer 420b.

In a manufacturing method according to an embodiment, the first and second resistive material layers 420a and 420b may be formed using the same source material on the first and second electrode pattern layers 440 and 450 and the substrate 410, as described above and in FIG. 13. During this process, a relatively high concentration of oxygen may be provided initially, so that the first resistive material layer 420a including oxide having a low oxygen vacancy concentration may be formed. Subsequently, the second resistive material layer 420b including oxide having a relatively high oxygen vacancy concentration may be formed while decreasing the concentration of the injected oxygen. In some embodiments, the oxygen vacancies formed in the first and second resistive material layers 420a and 420b may be formed to have concentration gradients, respectively. In some embodiments, the concentrations of oxygen vacancies in the resistance change layer 420 can increase from a lower surface LS420 of the first resistive material layer 420a to an upper surface US420 of the second resistive material layer 420b.

In a manufacturing method according to another embodiment, the first and second resistive material layers 420a and 420b may be formed using the same source material on the first and second electrode pattern layers 440 and 450 and the substrate 410. A relatively low concentration of movable metal ions may be provided in the first resistive material layer 420a. Subsequently, the concentration of the provided movable metal ions may be increased in the second resistive material layer 420b. In some embodiments, the movable metal ions formed inside the first and second resistive material layers 420a and 420b may be formed to have concentration gradients, respectively. In some embodiments, the concentrations of the movable metal ions distributed in the resistance change layer 420 may increase from the lower surface LS420 of the first resistive material layer 420a to the upper surface US420 of the second resistive material layer 420b.

Figure 14:
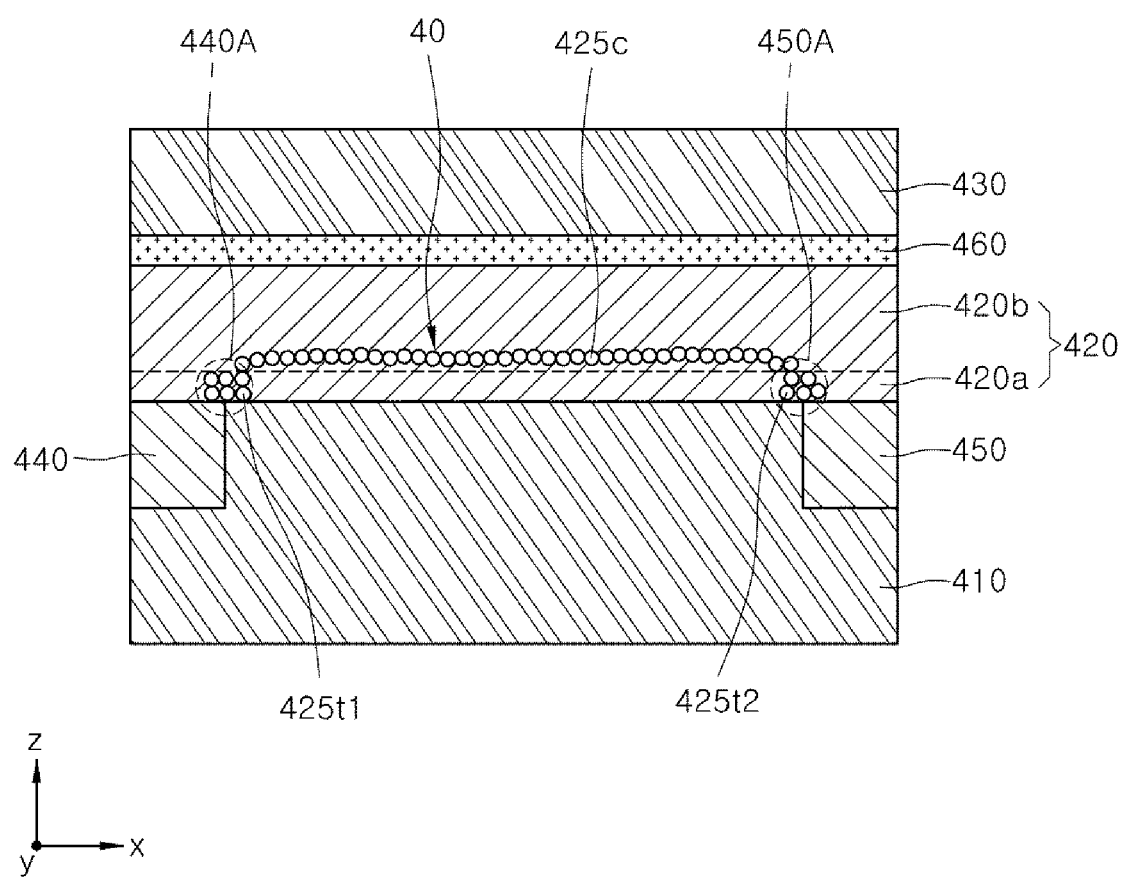
FIGS. 14 and 15 are views schematically illustrating a set operation and a reset operation of a nonvolatile memory device according to another embodiment of the present disclosure.
Figure 15:
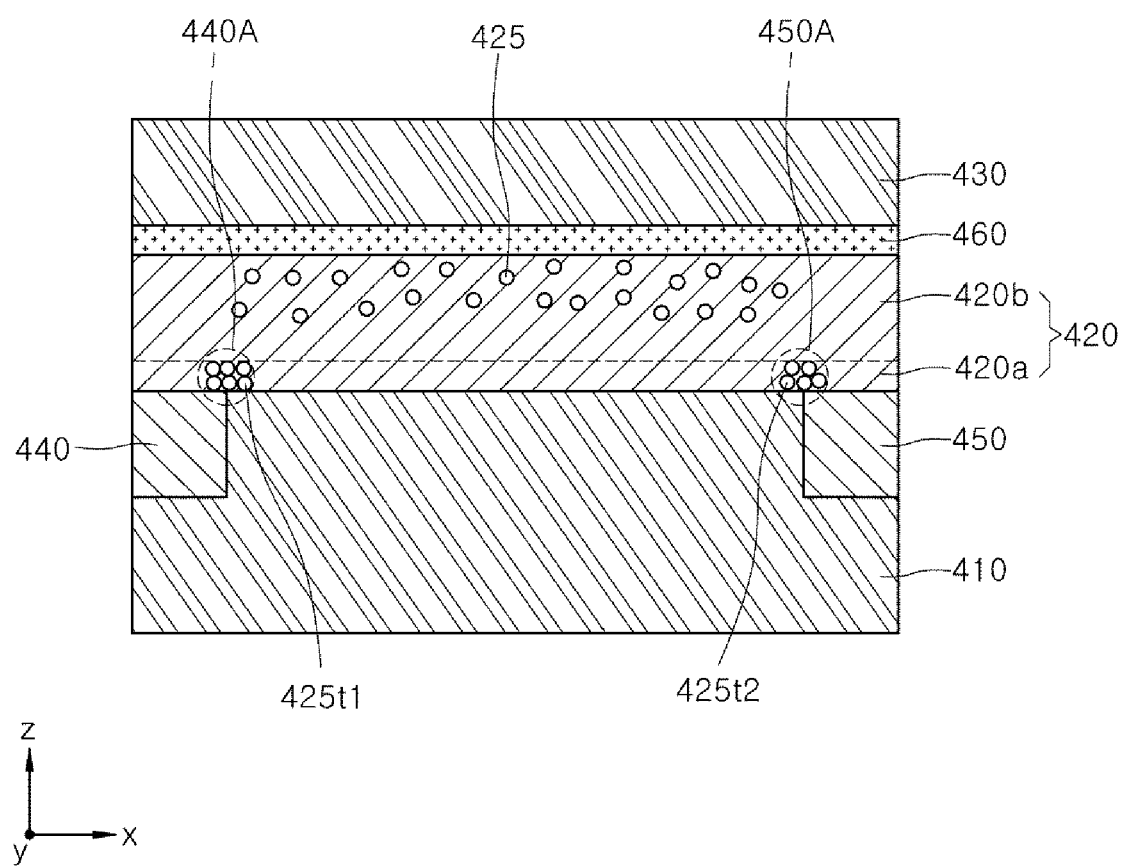

FIGS. 14 and 15 are views schematically illustrating a set operation and a reset operation of a nonvolatile memory device according to another embodiment of the present disclosure. Specifically, the set operation and the reset operation in connection with FIGS. 14 and 15 will be described using the nonvolatile memory device 4 of FIG. 13. For the convenience of description, a case in which the resistance change layer 420 is provided with oxygen vacancies having positive charges is described here as an embodiment. Embodiments contemplated by this disclosure are not limited to such, however, and operations may be substantially the same even when, for example, the resistance change layer 420 has movable metal ions having positive charges or movable metal ions having negative charges. In the latter case, the description of operations below also applies, except that the polarities of the first and second gate voltages and the polarities of the set voltage and the reset voltage may be reversed.

Referring to FIG. 14, for the set operation, a first gate voltage including a bias of a positive polarity may be applied to the gate electrode layer 430, and the oxygen vacancies in the first and second resistive material layers 420a and 420b may move toward the substrate 410. Subsequently, the first gate voltage applied to the gate electrode layer 430 may be removed, and a set voltage equal to or greater than a predetermined threshold voltage may be applied between first and second electrode pattern layers 440 and 450. Accordingly, an electric field due to the set voltage may be formed inside the resistance change layer 420.

The electric field generated by the set voltage may be concentrated on the pattern edge portions 440A and 450A of the first and second electrode pattern layers 440 and 450, respectively. In addition, the first resistive material layer 420a is a higher resistive body than the second resistive material layer 420b, so that when the set voltage is applied across the first resistive material layer 420a and the second resistive material layer 420b, a relatively larger voltage may be applied to the first resistive material layer 420a. As a result, first and second trigger filaments 425t1 and 425t2 may be formed in the first resistive material layer 420a adjacent to the pattern edge portions 440A and 450A, respectively.

Subsequently, a connecting filament 425c connected to the first and second trigger filaments 425t1 and 425t2 may be formed in the second resistive material layer 420b. The connecting filament 425c may connect the first and second trigger filaments 425t1 and 425t2, thereby completing a conductive filament 40.

Referring to FIG. 15, in a reset operation, a second gate voltage including a bias of a negative polarity may be applied to the gate electrode layer 430. In addition, while applying the second gate voltage, a reset voltage equal to or greater than a predetermined threshold voltage may be applied between the first and second electrode pattern layers 440 and 450. The reset voltage may have a different polarity from the set voltage.

According to an embodiment, the conductive filament 40 may decompose as a result of Joule heat generated by the reset voltage. As a result of the decomposition, the oxygen vacancies 425 are discharged from the conductive filament 40, and then distributed in the resistance change layer 420. The discharge of the oxygen vacancies 425 may occur at a relatively higher frequency in the connecting filament 425c of the second resistive material layer 420b. In addition, the discharged oxygen vacancies 425 may be expelled from the filament formation region due to the second gate voltage. As the oxygen vacancies 425 are discharged, at least a portion of the conductive filament 40 may be disconnected. As a result, the electrical resistance of the resistance change layer 420 may be increase. Accordingly, the internal resistance state of the resistance change layer 420 may be converted from a low resistance state to a high resistance state.

Figure 16:
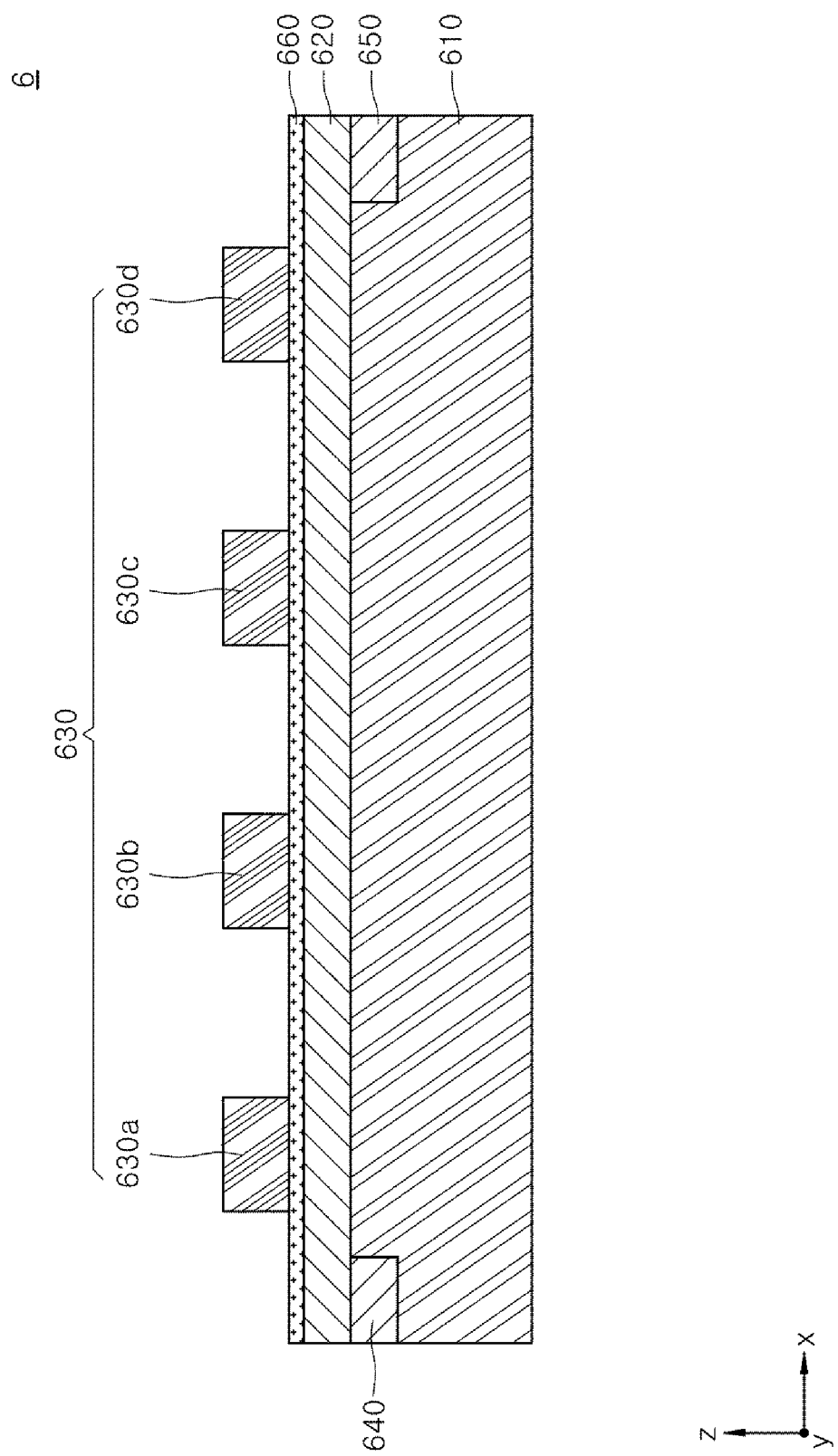
FIG. 16 is a cross-sectional view schematically illustrating a nonvolatile memory device according to another embodiment of the present disclosure.
Figure 17:
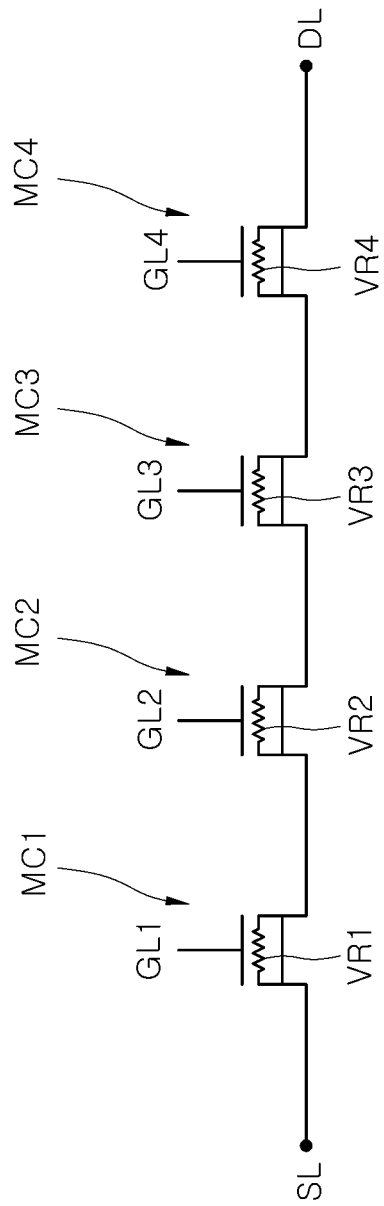
FIG. 17 is a circuit diagram of a nonvolatile memory device of FIG. 16.

FIG. 16 is a cross-sectional view schematically illustrating a nonvolatile memory device according to another embodiment of the present disclosure. FIG. 17 is a circuit diagram of a nonvolatile memory device of FIG. 16.

Referring to FIG. 16, a nonvolatile memory device 6 may include a substrate 610, a resistance change layer 620 disposed on the substrate 610, a gate insulation layer 660 disposed on the resistance change layer 620, a gate electrode layer 630 disposed on the gate insulation layer 660, and first and second electrode pattern layers 640 and 650 disposed in the substrate 610 to respectively contact different portions of the resistance change layer 620. In the present embodiment, the gate electrode layer 630 may include first to fourth gate pattern layers 630a, 630b, 630c and 630d disposed to be spaced apart from each other between the first and second electrode pattern layers 640 and 650. Gate voltages applied to the first to fourth gate pattern layers 630a, 630b, 630c and 630d may be independently controlled. In other words, different gate voltages may be applied to the first to fourth gate pattern layers 630a, 630b, 630c and 630d. In other embodiments, the number of the gate pattern layers 630a, 630b, 630c and 630d might not be limited to four, and the gate electrode layer 630 may have various other numbers of gate pattern layers.

The configurations of the substrate 610, the resistance change layer 620, the gate electrode layer 630, the first and second electrode pattern layers 640 and 650, and the gate insulation layer 660 of the nonvolatile memory device 6 may be substantially the same as the configurations of the substrate 110, the resistance change layer 120, the gate electrode layer 130, the first and second electrode pattern layers 140 and 150, and the gate insulation layer 160 of the nonvolatile memory device 2 described above with reference to FIG. 9. In some embodiments, the gate insulation layer 660 of the nonvolatile memory device 6 may be omitted.

FIG. 17 may be a circuit diagram of the nonvolatile memory device 6 of FIG. 16. Referring to FIG. 17, first to fourth memory cells MC1, MC2, MC3 and MC4 may be arranged between a source electrode SL and a drain electrode DL. Each of the first to fourth memory cells MC1, MC2, MC3 and MC4 may include a transistor-type nonvolatile memory element. The first to fourth memory cells MC1, MC2, MC3 and MC4 may respectively include first to fourth resistive element layers VR1, VR2, VR3 and VR4 disposed between the gate insulation layer and the conductive channel of the corresponding transistor. The first to fourth memory cells MC1, MC2, MC3 and MC4 may constitute a string of transistors connected in series.

The first and second electrode pattern layers 640 and 650 of FIG. 16 may correspond to the source electrode SL and the drain electrode DL of FIG. 17, respectively. The first to fourth gate pattern layers 630a, 630b, 630c and 630d of FIG. 16 may correspond to the first to fourth gate electrodes GL1, GL2, GL3 and GL4 of FIG. 17, respectively. The portions of the resistance change layer 620 controlled by the first to fourth gate pattern layers 630a, 630b, 630c and 630d of FIG. 16 may corresponding to the first to fourth resistive element layers VR1, VR2, VR3 and VR4 of FIG. 17, respectively.

Figure 18:
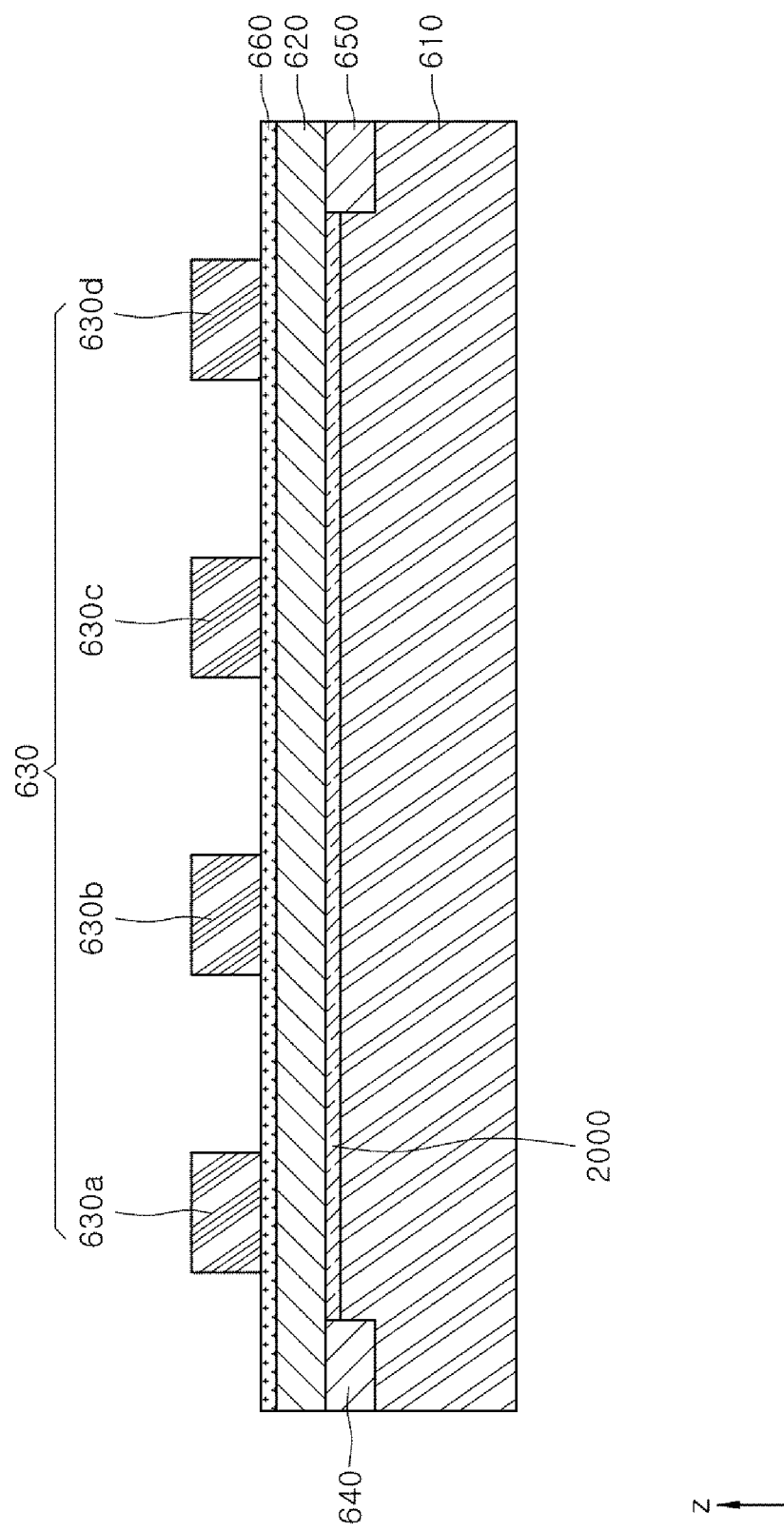
FIGS. 18 to 21 are views schematically illustrating operations of a nonvolatile memory device according to another embodiment of the present disclosure.
Figure 19:
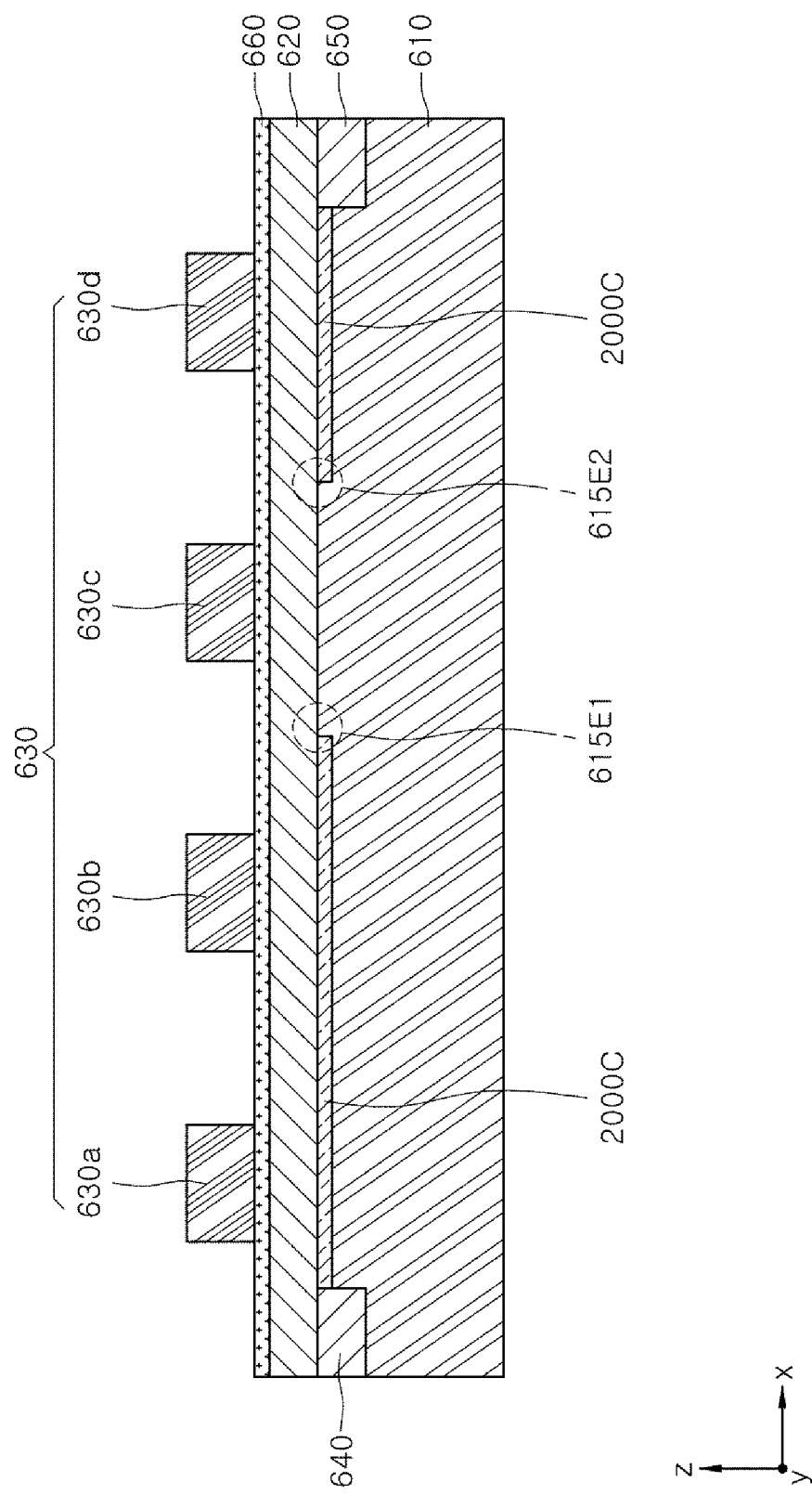
Figure 20:
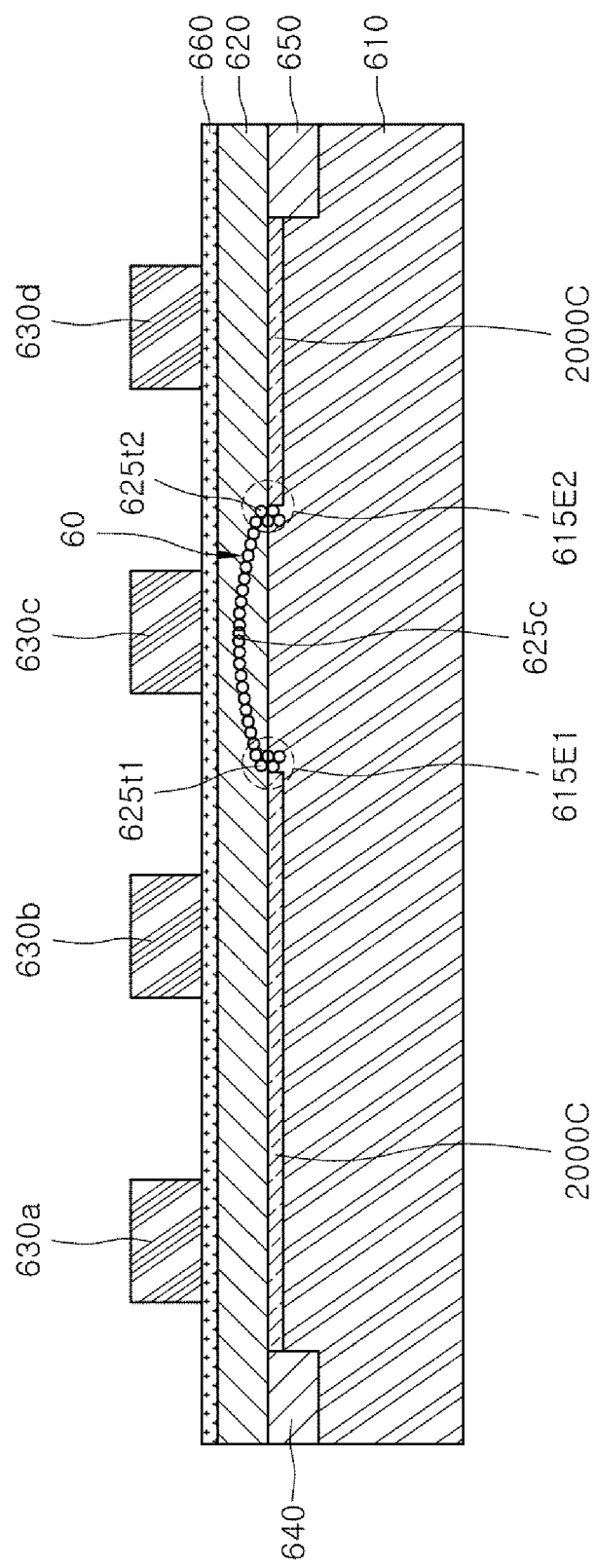
Figure 21:
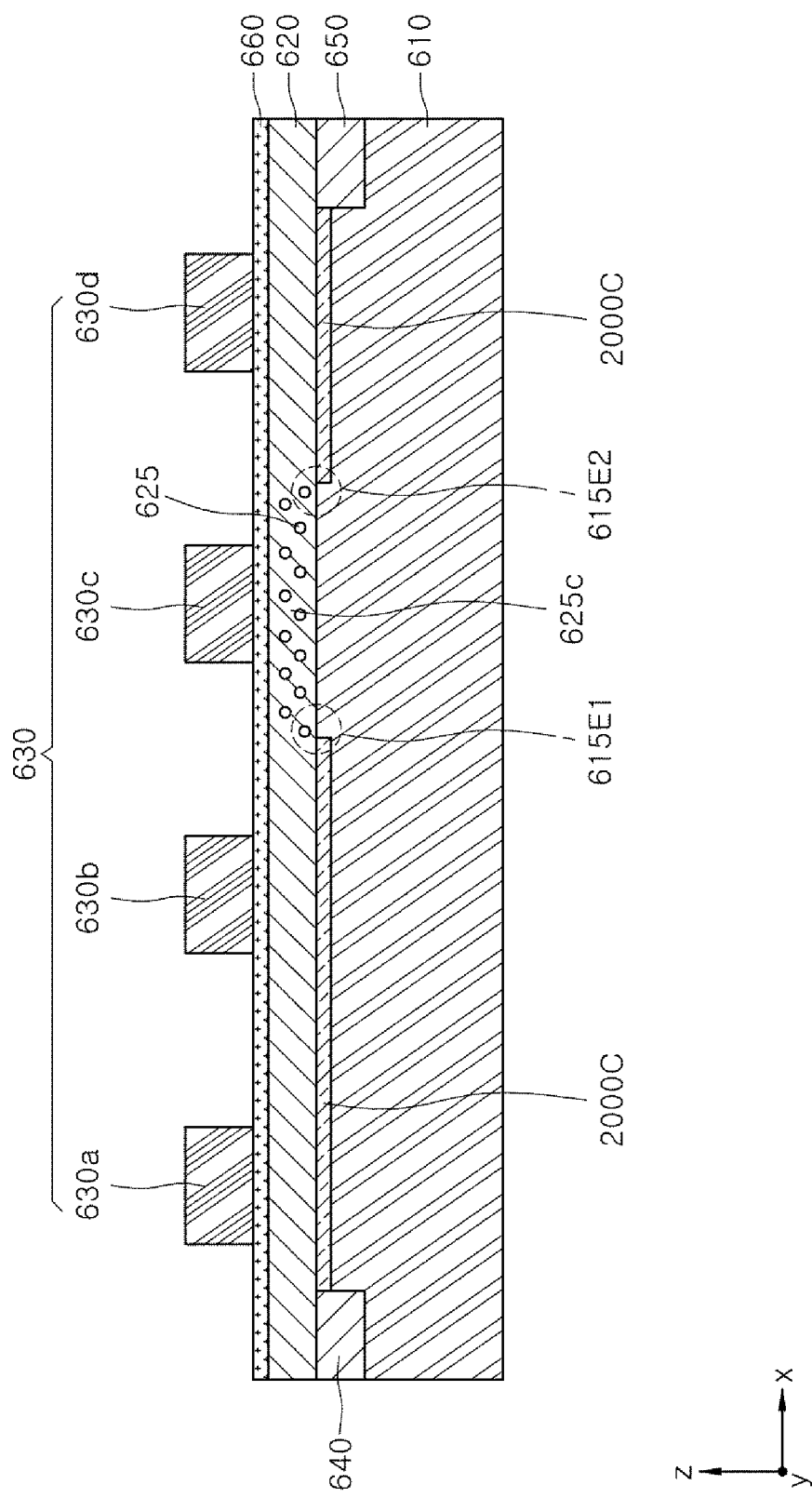

FIGS. 18 to 21 are views schematically illustrating operations of a nonvolatile memory device according to another embodiment of the present disclosure. Specifically, FIGS. 18 to 20 are views illustrating a set operation of a nonvolatile memory device, and FIGS. 18, 19 and 21 are views illustrating a reset operation of a nonvolatile memory device. Operating methods of the nonvolatile memory devices described in connection with FIGS. 18 to 21 will refer to the nonvolatile memory device 6 described above with reference to FIG. 16. As an example, a set operation and a reset operation will be described using the third memory cell MC3 having the third resistive element layer VR3 in the circuit diagram of FIG. 17. The third resistive element layer VR3 may be a portion corresponding to a portion of the resistance change layer 620 controlled by the third gate pattern layer 630c of FIG. 16.

Referring to FIG. 18, for the set operation, a predetermined first gate voltage including a bias of a positive polarity may be applied to the first to fourth gate pattern layers 630a, 630b, 630c and 630d. A conductive channel 2000 may be generated in a region of the substrate 610 adjacent to the resistance change layer 620 as a result of the first gate voltage. An electric field generated by the first gate voltage may also act on the regions of the substrate 610 that do not overlap the first to fourth gate pattern layers 630a, 630b, 630c and 630d in the z-direction, as well as on the regions of the substrate 610 that overlap the first to fourth gate pattern layers 630a, 630b, 630c and 630d in the z-direction. In the regions of the substrate 610 that do not overlap the first to fourth gate pattern layers 630a, 630b, 630c and 630d in the z-direction, the electric field formed by the gate pattern layers adjacent to each other extends in the x-direction, so that a driving force for forming the conductive channel 2000 can be generated. As a result, the conductive channel 2000 can be formed in a continuous form from the first electrode pattern layer 640 to the second electrode pattern layer 650. In addition, due to the repulsive force generated by the first gate voltage, the movable oxygen vacancies or the movable positive metal ions inside the resistance change layer 620 may move to a region adjacent to the substrate 610.

Referring to FIG. 19, while maintaining the first gate voltage applied to the first gate pattern layer 630a, the second gate pattern layer 630b, and the fourth gate pattern layer 630d, the first gate voltage applied to the third gate pattern layer 630c may be removed. Accordingly, the portion of the conductive channel 2000 controlled by the third gate pattern layer 630c is degraded or removed so that the conductive channel 2000 may be disconnected. Accordingly, the conductive channel 2000 may be converted into a disconnected conductive channel 2000C, and end portions 615E1 and 615E2 of the disconnected conductive channel 2000C may be electrically insulated from each other.

Referring to FIG. 20, while the first gate voltage is applied to the first gate pattern layer 630a, the second gate pattern layer 630b, and the fourth gate pattern layer 630d and removed from the third gate pattern layer 630c, a set voltage may be applied between the first and second electrode pattern layers 640 and 650. Here, the set voltage may be concentrated on the both end portions 615E1 and 615E2 of the disconnected conductive channel 2000C.

The set operation electric field formed by the set voltage may be applied to the resistance change layer 620 positioned between the both end portions 615E1 and 615E2 of the disconnected conductive channel 2000C. The movable oxygen vacancies or movable metal ions inside the resistance change layer 620 may be aggregated or bound to form a conductive filament 60 under the electric field resulting from the set operation. The conductive filament 60 may connect the both end portions 615E1 and 615E2 of the disconnected conductive channel 2000C.

In an embodiment, the conductive filament 60 may include trigger filaments 625t1 and 625t2 formed respectively at the end portions 615E1 and 615E2 of the disconnected conductive channel 2000C and a connecting filament 625c connecting the trigger filaments 625t1 and 625t2. The method of forming the trigger filaments 625t1 and 625t2 and the connecting filament 625c may be substantially the same as the method of forming the trigger filaments 125t1 and 125t2 and the connecting filament 125c described above with reference to FIGS. 2 to 5. Through the above-described set operation, the third memory cell MC3 can store signal information of a low resistance state.

Next, a reset operation for the third memory cell will be described with reference to FIGS. 18, 19 and 21. As described in connection with FIG. 18, the first gate voltage may be applied to the first to fourth gate pattern layers 630a, 630b, 630c and 630d to form a conductive channel 2000 in the substrate 610.

Next, as described above in connection with FIG. 19, the first gate voltage applied to the first gate pattern layer 630a, the second gate pattern layer 630b and the fourth gate pattern layer 630d may be maintained and the first gate voltage applied to the third gate pattern layer 630c may be removed. Accordingly, the portion of the conductive channel 2000 controlled by the third gate pattern layer 630c may be degraded or removed so that the conductive channel 2000 may be disconnected. As a result, the conductive channel 2000 may be converted into a disconnected conductive channel 2000C, and the end portions 615E1 and 615E2 of the disconnected conductive channel 2000C may be electrically insulated from each other.

Subsequently, as illustrated in FIG. 21, while the first gate voltage is applied to the first gate pattern layer 630a, the second gate pattern layer 630b and the fourth gate pattern layer 630d, a predetermined second gate voltage may be applied to the third gate pattern layer 630c. The second gate voltage may have an opposite polarity to the first gate voltage. That is, the second gate voltage may include a bias of a negative polarity. In addition, a reset voltage may be applied between the first and second electrode pattern layers 640 and 650. The reset voltage may have an opposite polarity to the set voltage.

Referring to FIG. 21, if the conductive filament 60 connecting the both end portions 615E1 and 615E2 of the disconnected conductive channel 2000C exists in the resistance change layer 620, then the conductive filament 60 may decompose and oxygen vacancies 625 may be discharged from the conductive filament 60 due to the reset voltage. In addition, the oxygen vacancies 625 may move toward the third gate pattern layer 630c under the attraction force generated by the second gate voltage. Accordingly, the end portions 615E1 and 615E2 of the disconnected conductive channel 2000C can be electrically insulated from each other again. Through the reset operation described above, the third memory cell MC3 can store signal information of a high resistance state.

Figure 22A:
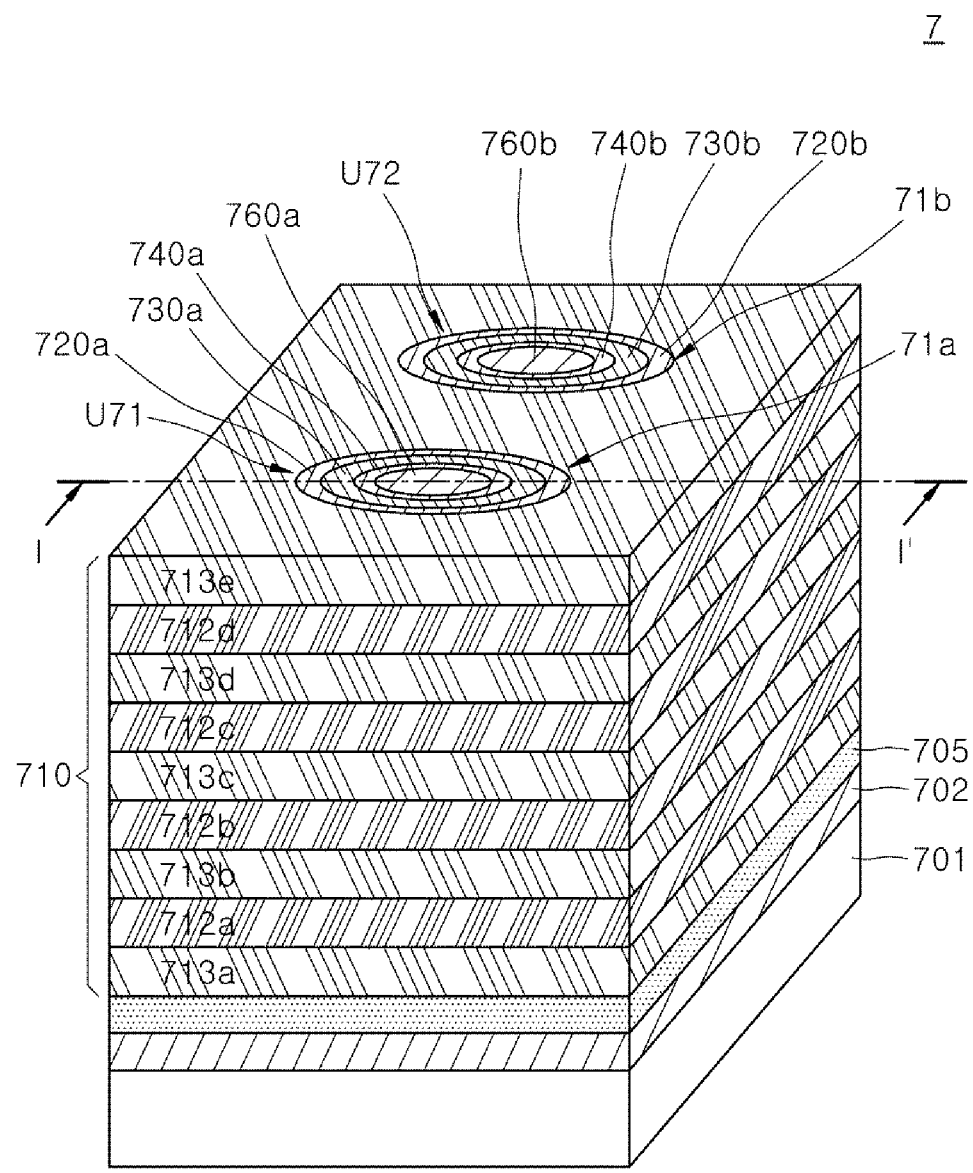
FIG. 22A is a perspective view schematically illustrating a nonvolatile memory device according to another embodiment of the present disclosure.
Figure 22B:
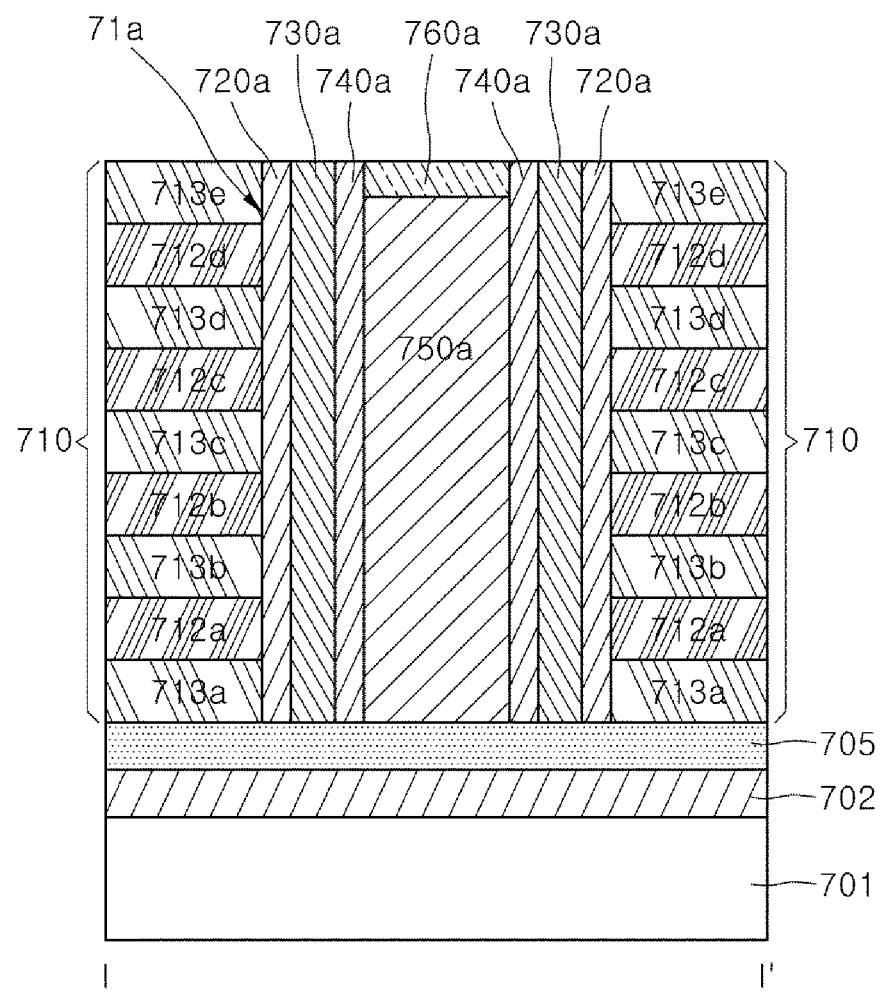
FIG. 22B is a cross-sectional view taken along a line I-I' of the nonvolatile memory device of FIG. 22A.
Figure 23:
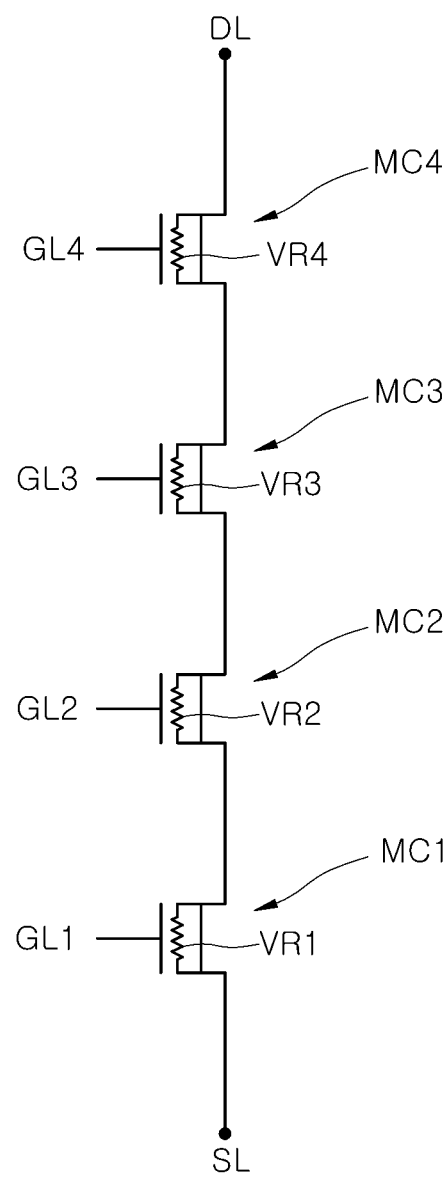
FIG. 23 is a circuit diagram of a nonvolatile memory device of FIGS. 22A and 22B.

FIG. 22A is a perspective view schematically illustrating a nonvolatile memory device according to another embodiment of the present disclosure. FIG. 22B is a cross-sectional view taken along a line I-I' of the nonvolatile memory device of FIG. 22A. FIG. 23 is a circuit diagram of a nonvolatile memory device of FIGS. 22A and 22B.

Referring to FIGS. 22A and 22B, a nonvolatile memory device 7 may include a substrate 701 and a gate structure 710 disposed on the substrate 701. In addition, the nonvolatile memory device 7 may include first and second hole patterns 71a and 71b penetrating the gate structure 710 over the substrate 701. The nonvolatile memory device 7 may include first and second resistance change layers 730a and 730b and first and second channel layers 740a and 740b, which sequentially cover the sidewall surfaces of the gate structure 710 inside the first and second hole patterns 71a and 71b, respectively.

The nonvolatile memory device 7 may further include first and second gate insulation layers 720a and 720b disposed between the sidewall surfaces of the gate structure 710 inside the first and second hole patterns 71a and 71b and the first and second resistance change layers 730a and 730b, respectively. The nonvolatile memory device 7 may further include a channel lower contact layer 705 contacting an end of each of the first and second channel layers 740a and 740b on the substrate 701. The nonvolatile memory device 7 may include first and second channel upper contact layers 760a and 760b contacting the other end of each of the first and second channel layers 740a and 740b. The first and second channel upper contact layers 760a and 760b may contact the other ends of the first and second channel layers 740a and 740b disposed in a direction (i.e., the z-direction) perpendicular to the substrate 701 from the end of each of the first and second channel layers 740a and 740b.

Referring to FIGS. 22A and 22B, substrate 701 may include a semiconductor material. Specifically, the semiconductor material may include silicon (Si), germanium (Ge), gallium arsenide (GaAs), molybdenum selenide (MoSe$_2$), hafnium selenide (HfSe$_2$), indium selenide (InSe), gallium selenide (GaSe), black phosphorus, indium-gallium-zinc oxide (IGZO), or a combination of two or more thereof.

A base insulation layer 702 may be disposed on the substrate 701. The base insulation layer 702 may electrically insulate the channel lower contact layer 705 from the substrate 701. The base insulation layer 702 may include an insulating material. The insulating material may include, for example, oxide, nitride, oxynitride, or a combination of two or more thereof.

The channel lower contact layer 705 may be disposed on the base insulation layer 702. The channel lower contact layer 705 may be electrically connected to the first and second channel layers 740*a* and 740*b*. Although not illustrated, the channel lower contact layer 705 may be electrically connected to the source electrode. The channel lower contact layer 705 may include a conductive material. The conductive material may include, for example, a doped semiconductor material, metal, conductive metal nitride, conductive metal carbide, conductive metal silicide, or conductive metal oxide. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

The gate structure 710 may be disposed on the channel lower contact layer 705. The gate structure 710 may include first to fourth gate electrode layers 712*a*, 712*b*, 712*c* and 712*d* and first to fifth interlayer insulation layers 713*a*, 713*b*, 713*c*, 713*d* and 713*e*, which are alternately stacked along a first direction (i.e., the z-direction) perpendicular to the substrate 701. The first interlayer insulation layer 713*a* may be disposed to contact the channel lower contact layer 705. The fifth interlayer insulation layer 713*e* may be disposed as an uppermost layer of the gate structure 710.

Each of the first to fourth gate electrode layers 712*a*, 712*b*, 712*c* and 712*d* may include a conductive material. The conductive material may include, for example, a doped semiconductor material, metal, conductive metal nitride, conductive metal carbide, conductive metal silicide, or conductive metal oxide. The conductive material may include, for example, silicon (Si) doped with an n-type dopant or a p-type dopant, tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Each of the first to fifth interlayer insulation layers 713*a*, 713*b*, 713*c*, 713*d* and 713*e* may include an insulating material. The insulating material may include, for example, oxide, nitride, oxynitride, or a combination of two or more thereof.

In some embodiments, the number of the gate electrode layers of the gate structure 710 is not necessarily limited to four. The gate electrode layers may be arranged in various other numbers, and the interlayer insulating layers may insulate the gate electrode layers from each other along the first direction (i.e., z-direction).

Referring to FIGS. 22A and 22B, the first and second hole patterns 71*a* and 71*b* may be formed to penetrate the gate structure 710 on the channel lower contact layer 705. In an embodiment, the first and second hole patterns 71*a* and 71*b* may be spaced apart from each other in the y-direction. The first and second hole patterns 71*a* and 71*b* may be formed, for example, by known lithography and etching processes.

The first and second gate insulation layers 720*a* and 720*b* may be respectively disposed inside the first and second hole patterns 71*a* and 71*b* to cover the sidewall surfaces of the gate structure 710. Each of the first and second gate insulation layers 720*a* and 720*b* may include an insulating material. Each of the first and second gate insulation layers 720*a* and 720*b* may include, for example, silicon oxide, silicon nitride, silicon oxynitride, aluminum oxide, hafnium oxide, and the like.

The first and second resistance change layers 730*a* and 730*b* may be disposed on the first and second gate insulation layers 720*a* and 720*b*, respectively. The first and second resistance change layers 730*a* and 730*b* may cover the sidewall surfaces of the gate structure 710 inside the first and second hole patterns 71*a* and 71*b*, respectively with the first and second gate insulation layers 720*a* and 720*b* disposed therebetween. Each of the first and second resistance change layers 730*a* and 730*b* may include a variable resistance material. The variable resistance material may include a movable oxygen vacancy or a movable metal ion. The metal ion may be a positive ion or a negative ion. The variable resistance material may be substantially the same as the variable resistance material constituting the resistance change layer 120 of the nonvolatile memory device 1 described above with reference to FIG. 1.

The first and second channel layers 740*a* and 740*b* may be disposed on the first and second resistance change layers 730*a* and 730*b*, respectively. The first and second channel layers 740*a* and 740*b* may cover the first and second resistance change layers 730*a* and 730*b* inside the first and second hole patterns 71*a* and 71*b*, respectively. Each of the first and second channel layers 740*a* and 740*b* may include a semiconductor material. The semiconductor material may include silicon (Si), germanium (Ge), and gallium arsenide (GaAs), and like materials, as an example. As another example, the semiconductor material may include a two-dimensional semiconductor material. The two-dimensional semiconductor material may include transition metal dichalcogenide (TMDC), black phosphorus, or the like. The transition metal dichalcogenide (TMDC) may include, for example, molybdenum selenide (MoSe$_2$), hafnium selenide (HfSe$_2$), indium selenide (InSe), gallium selenide (GaSe), and the like. The semiconductor material may include, for example, metal oxide such as indium-gallium-zinc oxide (IGZO).

Meanwhile, first and second filling insulation layers 750*a* and 750*b* may be respectively disposed in the first and second hole patterns 71*a* and 71*b*, in which the first and second gate insulation layers 720*a* and 720*b*; the first and second resistance change layers 730*a* and 730*b*; and the first and second channel layers 740*a* and 740*b* are formed, respectively. The first and second filling insulation layers 750*a* and 750*b* may include, for example, oxide, nitride, oxynitride, or a combination of two or more thereof.

The first and second channel upper contact layers 760*a* and 760*b* may be disposed on the first and second filling insulation layers 750*a* and 750*b* inside the first and second hole patterns 71*a* and 71*b*, respectively. Each of the first and second channel upper contact layers 760*a* and 760*b* may contact an end of each of the first and second channel layers 740*a* and 740*b*, respectively. The first and second channel upper contact layers 760*a* and 760*b* may be electrically connected to a drain electrode (not illustrated). In some embodiments, the first and second channel upper contact layers 760a and 760b may be disposed outside of the first and second hole patterns 71a and 71b, respectively. As an example, the first and second channel upper contact layers 760a and 760b may be disposed on the first and second channel layers 740a and 740b, and be electrically connected to, the first and second channel layers 740a and 740b, respectively.

Each of the first and second channel upper contact layers 760a and 760b may include a conductive material. The conductive material may include, for example, a doped semiconductor material, metal, conductive metal nitride, conductive metal carbide, conductive metal silicide, or conductive metal oxide. The conductive material may include, for example, n-type dope silicon (Si), tungsten (W), titanium (Ti), copper (Cu), aluminum (Al), ruthenium (Ru), platinum (Pt), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, in the nonvolatile memory device 7 according to an embodiment, the first and second hole patterns 71a and 71b penetrating the gate structure 710 on the channel lower contact layer 705 may be formed. The first and second gate insulation layers 720a and 720b, the first and second resistance change layers 730a and 730b, and the first and second channel layers 740a and 740b may be disposed in the first and second hole patterns 71a and 71b, respectively. In addition, the first and second channel upper layers 760a and 760b may be disposed at upper portions of the first and second hole patterns 71a and 71b to contact portions of the first and second channel layers 740a and 740b, respectively.

The first to fourth gate electrode layers 712a, 712b, 712c and 712d and the first to fifth interlayer insulation layers 713a, 713b, 713c, 713d and 713e of the gate structure 710 may be disposed, on the channel lower contact layer 705, to surround the first gate insulation layer 720a, the first resistance change layer 730a, and the first channel layer 740a in the first hole pattern 71a. Similarly, the first to fourth gate electrode layers 712a, 712b, 712c and 712d and the first to fifth interlayer insulation layers 713a, 713b, 713c, 713d and 713e of the gate structure 710 may be disposed, on the channel lower contact layer 705, to surround the second gate insulation layer 720b, the second resistance change layer 730b, and the second channel layer 740b in the second hole pattern 71b.

In some embodiments, the number of the hole patterns penetrating the gate structure 710 is not necessarily limited to two.

The hole patterns may be formed in various numbers, and a gate insulation, a resistance change layer, a channel layer, a filling insulation layer, and a channel upper contact layer may be disposed in each of the hole patterns.

In some embodiments, the first and second gate insulation layers 720a and 720b may be omitted, and the first and second resistance change layers 730a and 730b may be directly disposed on the sidewall surfaces of the gate structure 710.

In some embodiments, the configurations of the first and second resistance change layers 730a and 730b may each be substantially the same as the configuration of the resistance change layer 320 of the nonvolatile memory device 3 described above with reference to FIG. 10, or may each be substantially the same as the configuration of the resistance change layer 420 of the nonvolatile memory device 4 described above with reference to FIG. 13. That is, each of the first and second resistance change layers 730a and 730b may have a plurality of resistive material layers, and the resistive material layers may have different concentrations of oxygen vacancies or metal ions. For example, the first resistance change layer 730a may include a first resistive material layer in contact with the first channel layer 740a and a second resistive material layer disposed on the first resistive material layer and in contact with first gate insulation layer 720a. In this case, the first resistive material layer may have a lower concentration of oxygen vacancies or a lower concentration of movable metal ions than the second resistive material layer. In addition, the first resistive material layer may be a higher resistive body than the second resistive material layer. Similarly, the second resistance change layer 730b may have substantially the same configuration as the first resistance change layer 730a.

Referring to FIG. 22A again, in an embodiment the nonvolatile memory device 7 may include separate first and second memory element units U71 and U72, which perform operations independently of each other, for the first and second hole patterns 71a and 71b, respectively. The channel lower contact layer 705 may be shared by the first and second memory element units U71 and U72. Further, the first and second memory element units U71 and U72 may include first and second channel upper contact layers 760a and 760b, respectively.

FIG. 23 is a circuit diagram of the first memory element unit U71 of nonvolatile memory device 7, which includes the first to fourth gate electrode layers 712a, 712b, 712c and 712d and, inside the first hole pattern 71a, the first gate insulation layer 720a, the first resistance change layer 730a, and the first channel layer 740a. The first memory element unit U71 may include transistor-type first to fourth memory cells MC1, MC2, MC3 and MC4. Although not illustrated, the second memory element unit U72 may have substantially the same circuit diagram as the first memory element unit U71.

Referring to FIG. 23, the first to fourth memory cells MC1, MC2, MC3 and MC4 may be connected in series in a string form between the source electrode SL and the drain electrode DL. Each of the first to fourth memory cells MC1, MC2, MC3 and MC4 may include a nonvolatile memory element in the form of a transistor. The first to fourth memory cells MC1, MC2, MC3 and MC4 may have first to fourth resistive element layers VR1, VR2, VR3 and VR4, respectively, disposed between the gate insulation layer of the corresponding transistor and the conductive channel.

In FIGS. 22A and 22B, the channel lower contact layer 705 and the first channel upper contact layer 760a may be electrically connected to a source electrode (not illustrated) and a drain electrode (not illustrated), respectively. The source electrode and the drain electrode may correspond to the source electrode SL and the drain electrode DL of FIG. 23, respectively. The first to fourth gate electrode layers 712a, 712b, 712c and 712d of FIGS. 22A and 22B may correspond to the first to fourth gate electrodes GL1, GL2, GL3 and GL4, respectively. The regions of the first resistance change layer 730a, controlled by the first to fourth gate electrode layers 712a, 712b, 712c and 712d of FIGS. 22A and 22B, may correspond to the first to fourth resistive element layers VR1, VR2, VR3 and VR4 of FIG. 23, respectively.

Figure 24:
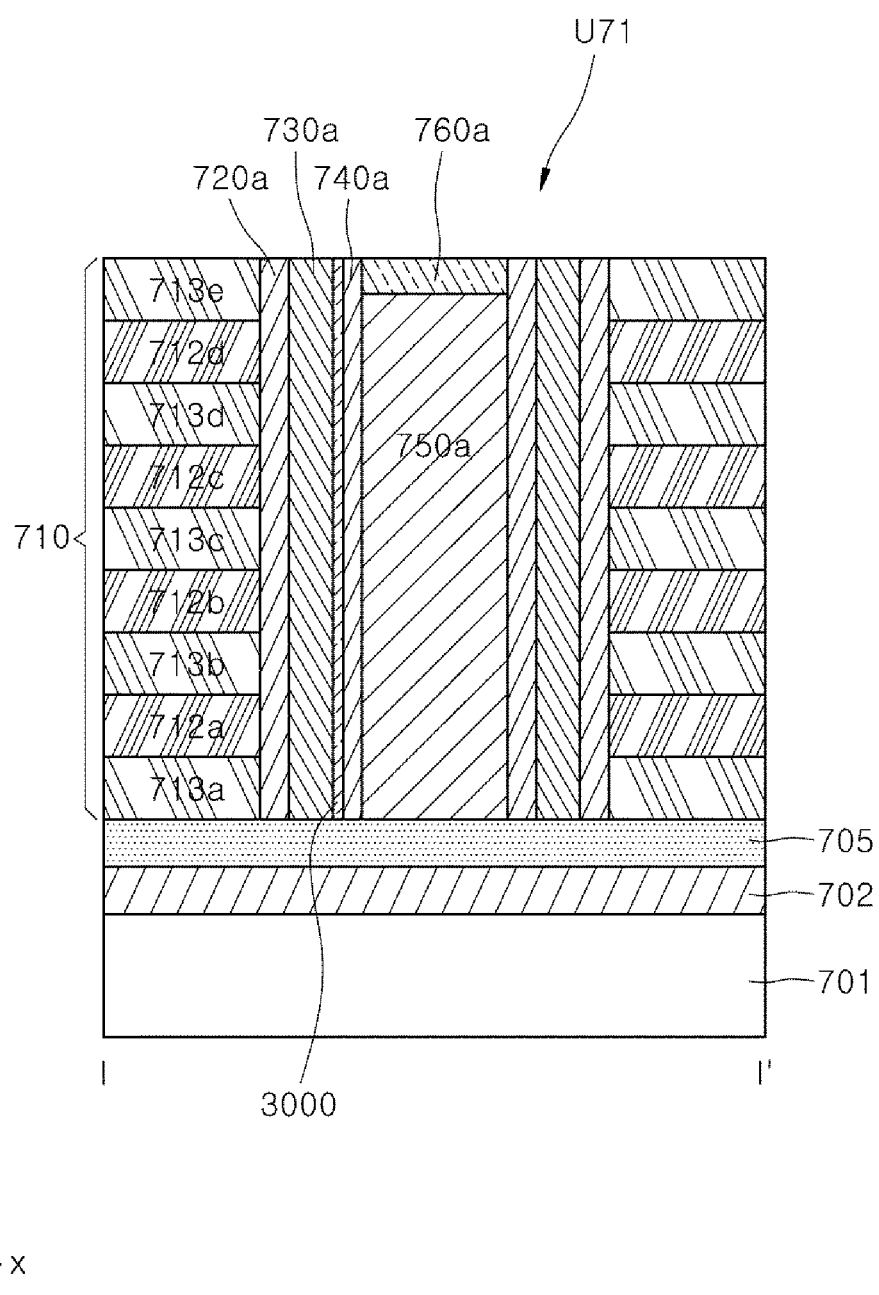
FIGS. 24 to 27 are views schematically illustrating an operation of a nonvolatile memory device according to another embodiment of the present disclosure.
Figure 25:
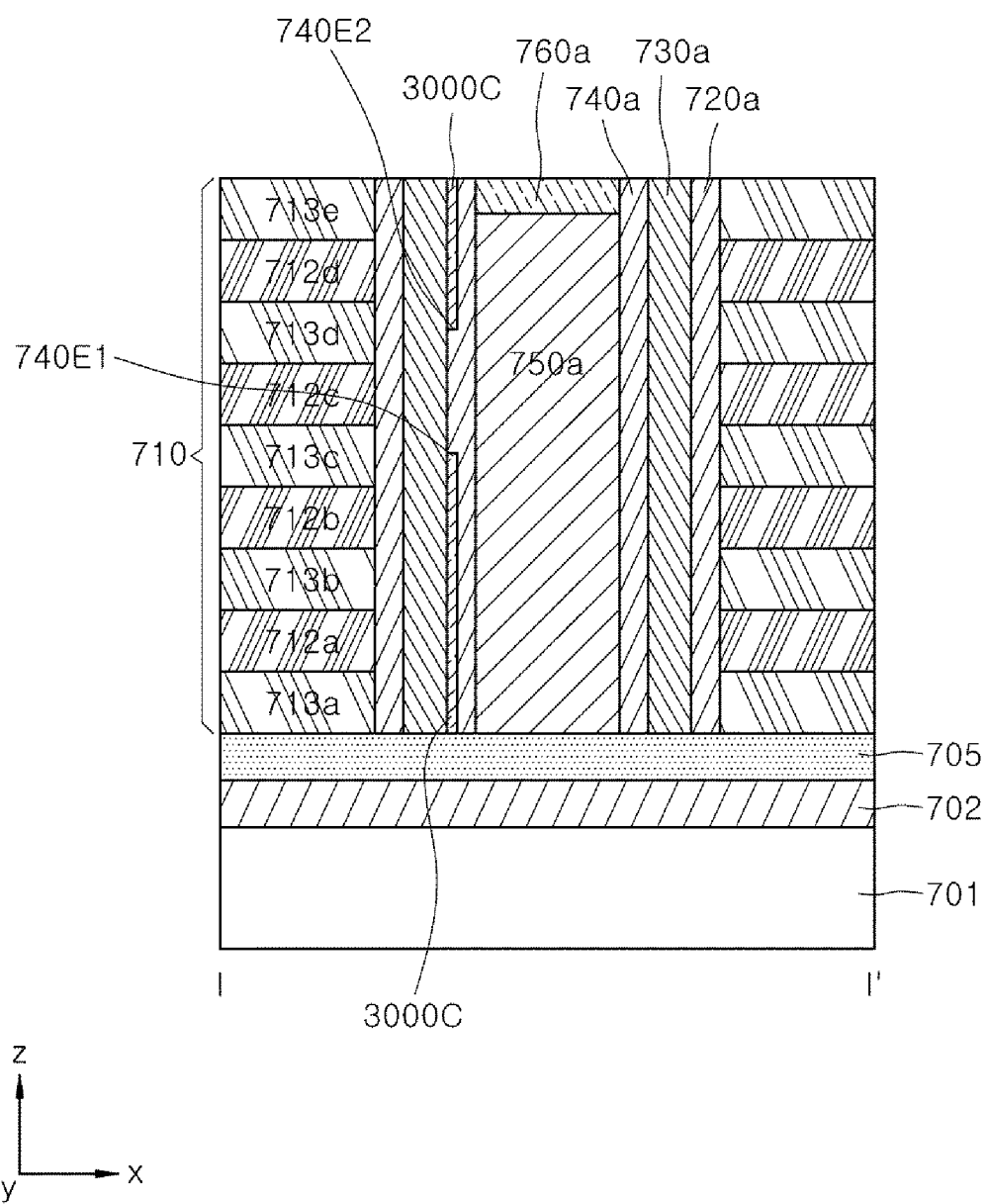
Figure 26:
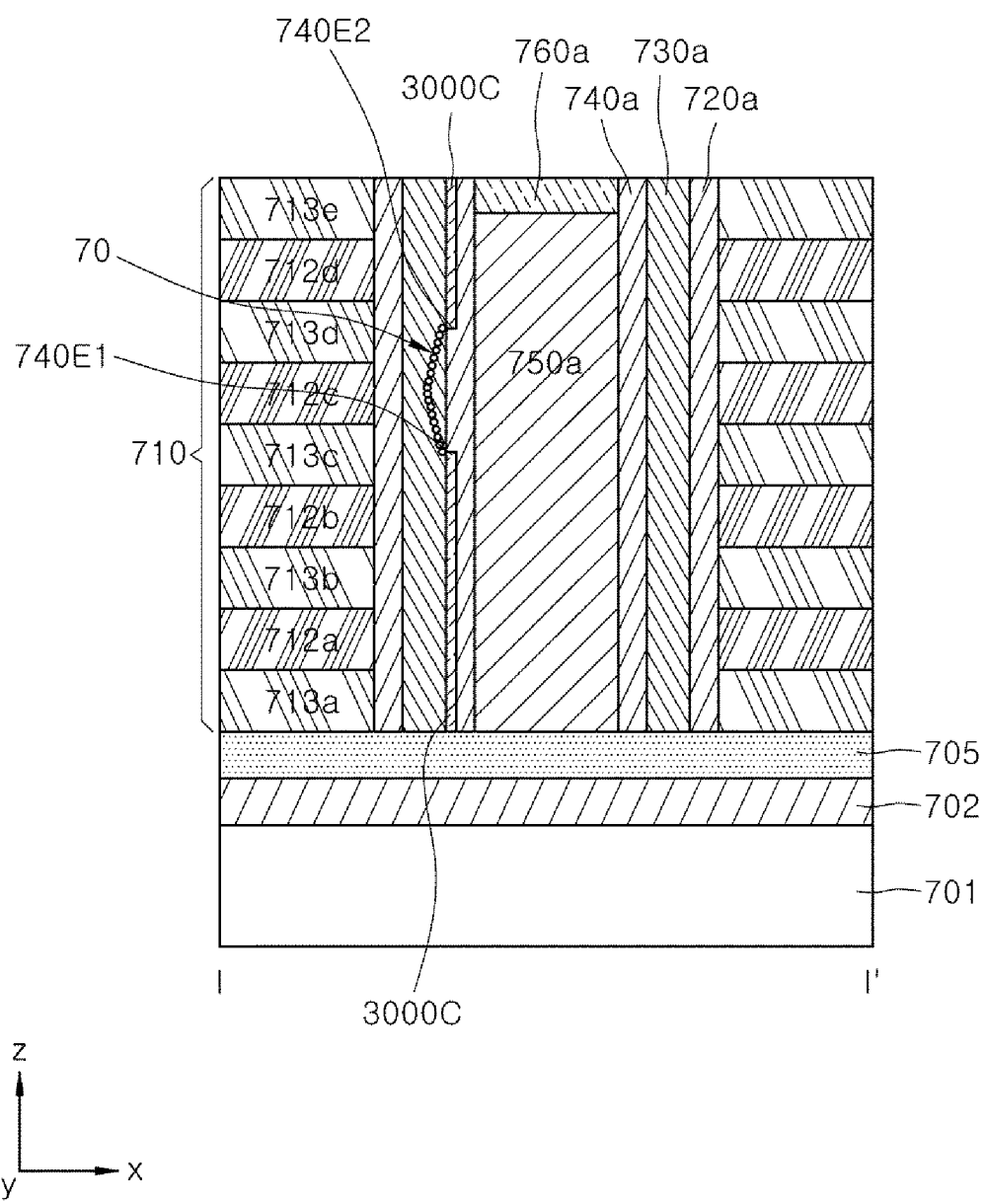
Figure 27:
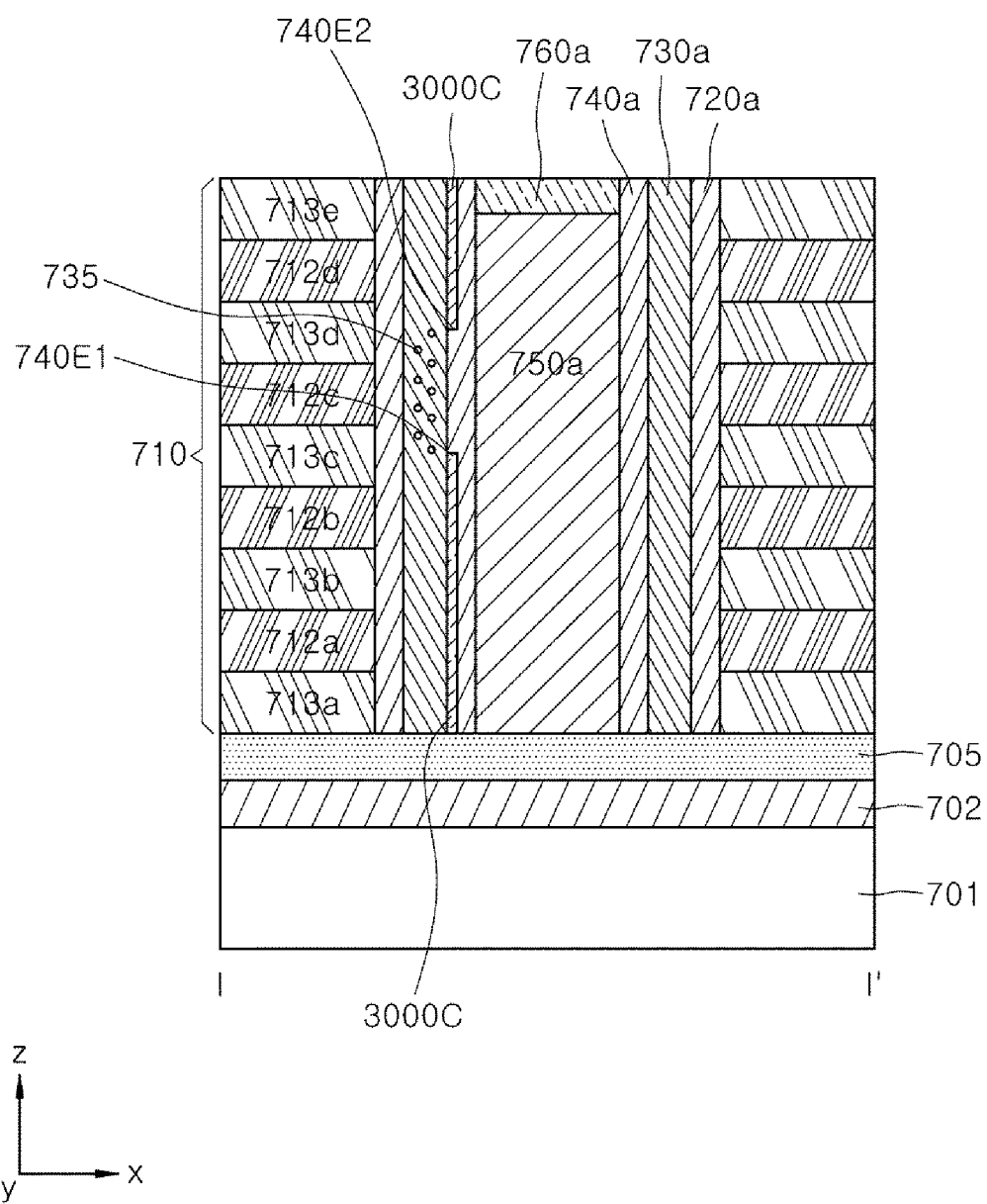

FIGS. 24 to 27 are views schematically illustrating operations of a nonvolatile memory device according to another embodiment of the present disclosure. Specifically, FIGS. 24 to 26 are views illustrating a set operation of a nonvolatile memory device, and FIGS. 24, 25 and 27 are views illustrating a reset operation of the nonvolatile memory device.

The operation methods of the nonvolatile memory device described in connection with FIGS. 24 to 27 will refer to the nonvolatile memory device 7 described above with reference to FIGS. 22A and 22B. For the convenience of explanation, the set operation and the reset operation will be explained using a third memory cell MC3 having a third resistive element layer VR3 of the circuit diagram of FIG. 23 as an example. The third resistive element layer VR3 may correspond to a portion of the first resistance change layer 730a controlled by the third gate electrode layer 712c of FIGS. 22A and 22B.

Referring to FIG. 24, for the set operation, a predetermined first gate voltage including a bias of a positive polarity may be applied to first to fourth gate electrode layers 712a, 712b, 712c and 712d. A conductive channel 3000 may be formed in a region of a first channel layer 740a adjacent to the first resistance change layer 730a as a result of the first gate voltage. The electric field generated by the first gate voltage may also act on regions of the first channel layer 740a which do not overlap the first to fourth gate electrode layers 712a, 712b, 712c and 712d in the x-direction, as well as on the regions of the first channel layer 740a that overlap the first to fourth gate electrode layers 712a, 712b, 712c and 712d in the x-direction. In the regions of the first channel layer 740a that do not overlap the first to fourth gate electrode layers 712a, 712b, 712c and 712d in the x-direction, the electric field generated by the neighboring gate electrode layers may extend in the z-direction, so that a driving force for forming the conductive channel 3000 can be generated. As a result, the conductive channel 3000 may be formed in a continuous form across the first channel layer 740a along the z-direction. In addition, due to the repulsive force generated by the first gate voltage, the movable oxygen vacancies or the movable positive metal ions in the first resistance change layer 730a may move to a region adjacent to the first channel layer 740a.

Referring to FIG. 25, while maintaining the first gate voltage applied to the first gate electrode layer 712a, the second gate electrode layer 712b and the fourth gate electrode layer 712d, the first voltage applied to the third gate electrode layer 712c may be removed. Accordingly, the portion of the conductive channel 3000 controlled by the third gate electrode layer 712c may be degraded or removed so that the conductive channel 3000 may be disconnected. Accordingly, the conductive channel 3000 may be converted into a disconnected conductive channel 3000C and the ends 740E1 and 740E2 of the disconnected conductive channel 3000C may be electrically insulated from each other.

Referring to FIG. 26, as the first gate voltage is applied to the first gate electrode layer 712a, the second gate electrode layer 712b and the fourth gate electrode layer 712d and removed from the third gate electrode layer 712c, a set voltage may be applied between the channel lower contact layer 705 and the first channel upper contact layer 760a. In this case, the set voltage may be concentrated on the both ends 740E1 and 740E2 of the disconnected conductive channel 3000C.

A set operation electric field formed by the set voltage may be applied to the first resistance change layer 730a positioned between the both ends 740E1 and 740E2 of the disconnected conductive channel 3000C. The movable oxygen vacancies or the movable positive metal ions in the first resistance change layer 730a may be aggregated or bound to form a conductive filament 70 under the electric field resulting from the set operation. The conductive filament 70 may connect the both ends 740E1 and 740E2 of the disconnected conductive channel 3000C.

In an embodiment, the conductive filament 70 may include trigger filaments formed at both ends 740E1 and 740E2 of the disconnected channel 3000C and a connecting filament connecting the trigger filaments. The trigger filaments and the connecting filament may be formed by substantially the same methods used to form the trigger filaments 125t1 and 125t2 and the connecting filament 125c described above in connection with FIGS. 2 to 5. Through the above-described set operation, the third memory cell MC3 can store signal information of a low resistance state.

Next, a reset operation for the third memory cell MC3 will be described. As described above in connection with FIG. 24, the first gate voltage may be applied to the first to fourth gate electrode layers 712a, 712b, 712c and 712d to form a conductive channel 3000 in the first channel layer 740a.

Next, as described above in connection with FIG. 25, the first gate voltage applied to the first gate electrode layer 712a, the second gate electrode layer 712b, and the fourth gate electrode layer 712d may be maintained, and the first gate voltage applied to the third gate electrode layer 712c may be removed. Accordingly, a portion of the conductive channel 3000 controlled by the third gate electrode layer 712c may be degraded or removed so that the conductive channel 3000 may be disconnected. Accordingly, the conductive channel 3000 may be converted into a disconnected conductive channel 3000C and both ends 740E1 and 740E2 of the disconnected conductive channel 3000C may be electrically insulated from each other.

Subsequently, as illustrated in FIG. 27, while the first gate voltage is applied to the first gate electrode layer 712a, the second gate electrode layer 712b, and the fourth gate electrode layer 712d, a predetermined second gate voltage may be applied to the third gate electrode layer 712c. The second gate voltage may have an opposite polarity to the first gate voltage. That is, the second gate voltage may include a bias of a negative polarity. Then, a reset voltage may be applied between the channel lower contact layer 705 and the first channel upper contact layer 760a. The reset voltage may have an opposite polarity to the set voltage.

If the conductive filament 70 connecting the both ends 740E1 and 740E2 of the disconnected conductive channel 3000C exists in the first resistance change layer 730a, then the conductive filament 70 may decompose and oxygen vacancies 735 may be discharged from the conductive filament 70 due to the second gate voltage and the reset voltage. The discharged oxygen vacancies 735 may move toward the third gate electrode layer 712c under the attraction force generated by the second gate voltage. Accordingly, both ends 740E1 and 740E2 of the disconnected conductive channel 3000C may be electrically insulated again from each other. Through the reset operation described above, the third memory cell MC3 can store signal information of a high resistance state.

Figure 28A:
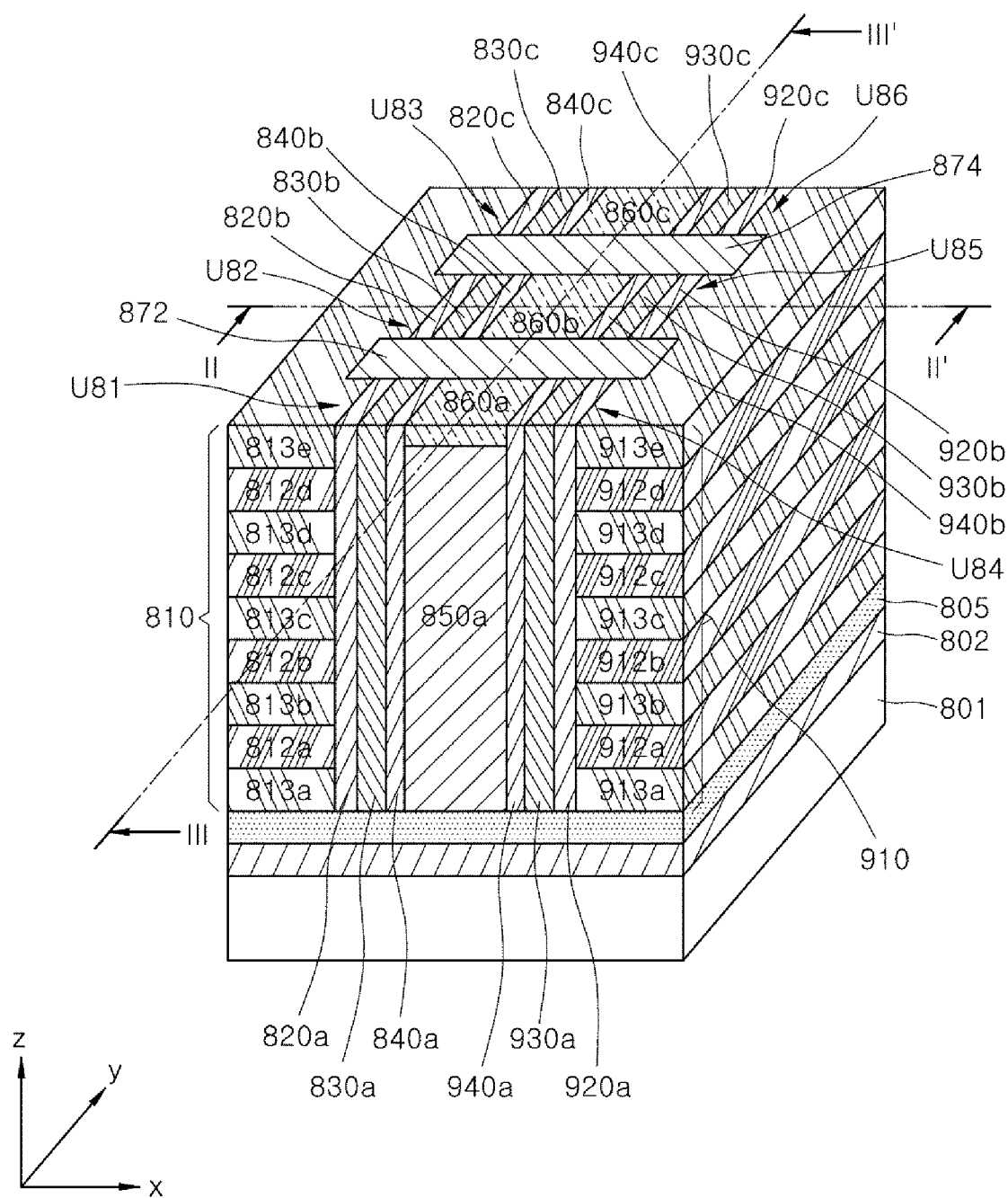
FIG. 28A is a perspective view schematically illustrating a nonvolatile memory device according to another embodiment of the present disclosure.
Figure 28B:
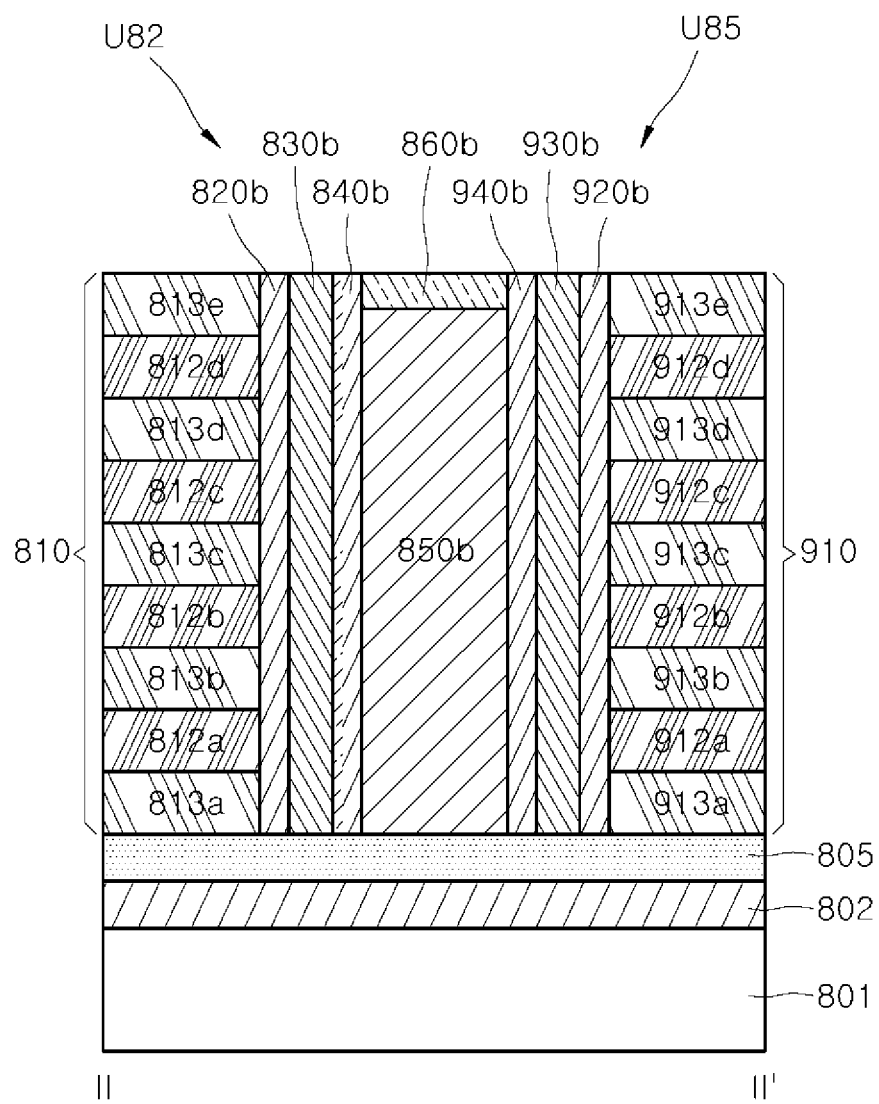
FIG. 28B is a cross-sectional view taken along a line II-II' of the nonvolatile memory device of FIG. 28A.
Figure 28C:
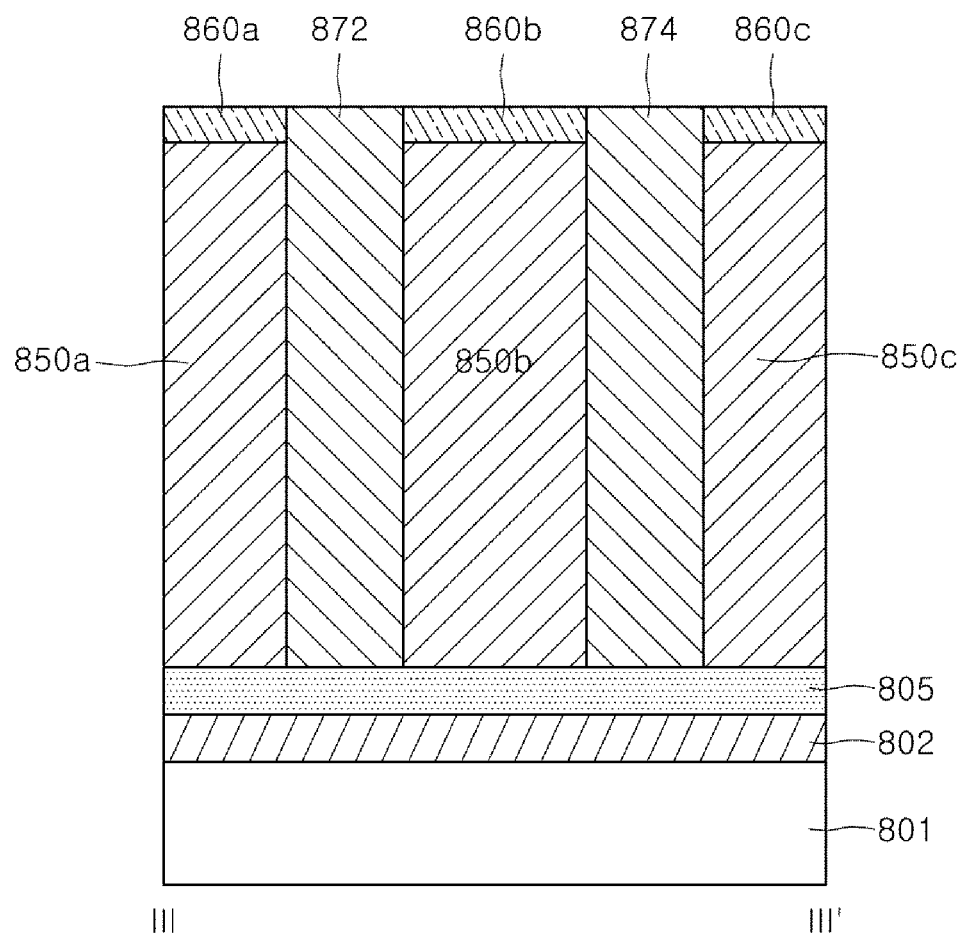
FIG. 28C is a cross-sectional view taken along a line II-II' of the nonvolatile memory device of FIG. 28A.

FIG. 28A is a perspective view schematically illustrating a nonvolatile memory device according to another embodiment of the present disclosure. FIG. 28B is a cross-sectional view taken along a line II-II' of the nonvolatile memory device of FIG. 28A. FIG. 28C is a cross-sectional view taken along a line III-III' of the nonvolatile memory device of FIG. 28A.

Referring to FIGS. 28A to 28C, a nonvolatile memory device 8 may include a substrate 801 and first and second gate structures 810 and 910 disposed on or over the substrate 801. The nonvolatile memory device 8 may have first to third gate insulation layers 820a, 820b and 820c covering a sidewall surface S1 of the first gate structure 810 on the substrate 801, first to third resistance change layers 830a, 830b and 830c and first to third channel layers 840a, 840b and 840c sequentially covering the first to third gate insulation layers 820a, 820b and 820c. In addition, the nonvolatile memory device 8 may have first to third gate insulation layers 920a, 920b and 920c covering a sidewall surface S2 of the second gate structure 910 on the substrate 801, first to third resistance change layers 930a, 930b and 930c, and first to third channel layers 940a, 940b and 940c sequentially covering the first to third gate insulation layers 920a, 920b and 920c.

In some embodiments, the first to third gate insulation layers 820a, 820b, 820c, 920a, 920b and 920c of the first and second gate structures 810 and 910 may be omitted. The first to third resistance change layers 830a, 830b, 830c, 930a, 930b and 930c may be disposed to directly contact the sidewall surfaces S1 and S2 of the first and second gate structures 810 and 910, respectively.

Referring to FIGS. 28A to 28C, the substrate 801 may be provided and may be substantially the same as the substrate 701 of the nonvolatile memory device 7 described above in connection with FIGS. 22A and 22B.

A base insulation layer 802 and a channel lower contact layer 805 may be sequentially disposed on the substrate 801. The configurations of the base insulation layer 802 and the channel lower contact layer 805 may be substantially the same as the configurations of the base insulation layer 702 and the channel lower contact layer 705 of the nonvolatile memory device 7 described above in connection with FIGS. 22A and 22B.

The first gate structure 810 may be disposed on the channel lower contact layer 805. The first gate structure 810 may include first to fourth gate electrode layers 812a, 812b, 812c and 812d and first to fifth interlayer insulation layers 813a, 813b, 813c, 813d and 813e, which are alternately disposed or stacked along a first direction (i.e., z-direction) perpendicular to the substrate 801. The first gate structure 810 may extend in a second direction (i.e., y-direction) perpendicular to the first direction (i.e., z-direction).

Each of the first to fourth gate electrode layers 812a, 812b, 812c and 812d may include a conductive material. The conductive material of each of the first to fourth gate electrode layers 812a, 812b, 812c and 812d may be substantially the same as the conductive material of the first to fourth gate electrode layers 712a, 712b, 712c and 712d of the nonvolatile memory device 7 described above in connection with FIGS. 22A and 22B. Each of the first to fifth interlayer insulation layers 813a, 813b, 813c, 813d and 813e may include an insulating material. The insulating material of the first to fifth interlayer insulation layers 813a, 813b, 813c, 813d and 813e may be substantially the same as the insulating material of the first to fifth interlayer insulation layers 713a, 713b, 713c, 713d and 713e of the nonvolatile memory device 7 described above in connection with FIGS. 22A and 22B.

In some embodiments, the number of the gate electrode layers of the first gate structure 810 might not necessarily be limited to four. The gate electrode layers may be arranged in various other numbers, and the interlayer insulation layers may insulate the gate electrode layers from each other along the first direction (i.e., z-direction).

Referring to FIGS. 28A to 28C, the first to third gate insulation layers 820a, 820b and 820c may be disposed on the channel lower contact layer 805 to cover the sidewall surface S1 of the first gate structure 810. The first to third gate insulation layers 820a, 820b and 820c may be separated from each other with respect to the second direction (i.e., y-direction) by first and second cell insulation structures 872 and 874. That is, the first to third gate insulation layers 820a, 820b and 820c may be spaced apart from each other with respect to the second direction (i.e., y-direction). Each of the first to third gate insulation layers 820a, 820b and 820c may include an insulating material. The insulating material of each of the first to third gate insulation layers 820a, 820b and 820c may be substantially the same as the insulating material of the first and second gate insulation layers 720a and 720b of the nonvolatile memory device 7 described above in connection with FIGS. 22A and 22B.

The first to third resistance change layers 830a, 830b and 830c and first to third channel layers 840a, 840b and 840c may be disposed on the channel lower contact layer 805 to sequentially cover the first to third gate insulation layers 820a, 820b and 820c. The first to third resistance change layers 830a, 830b and 830c may be separated from each other with respect to the second direction (i.e., y-direction) by the first and second cell insulation structures 872 and 874. Similarly, the first to third channel layers 840a, 840b and 840c may be separated from each other with respect to the second direction (i.e., y-direction) by the first and second cell insulation structures 872 and 874.

Each of the first to third resistance change layers 830a, 830b and 830c may include a variable resistance material. The variable resistance material of each of the first to third resistance change layers 830a, 830b and 830c may be substantially the same as the variable resistance material of the first and second resistance change layers 730a and 730b of the nonvolatile memory device 7 described above in connection with FIGS. 22A and 22B. Each of the first to third channel layers 840a, 840b and 840c may include a semiconductor material. The semiconductor material of each of the first to third channel layers 840a, 840b and 840c may be substantially the same as the semiconductor material of the first and second channel layers 740a and 740b of the nonvolatile memory device 7 described above in connection with FIGS. 22A and 22B.

Meanwhile, the second gate structure 910 may be disposed, spaced apart from the first gate structure 810 in a third direction (i.e., x-direction), on the channel lower contact layer 805. The second gate structure 910 may include first to the fourth gate electrode layers 912a, 912b, 912c and 912d and the first to fifth interlayer insulation layers 913a, 913b, 913c, 913d and 913e, which are alternately disposed or stacked along the first direction (i.e., z-direction). The configurations of the first to fourth gate electrode layers 912a, 912b, 912c and 912d and the first to fifth interlayer insulation layers 913a, 913b, 913c, 913d and 913e may be substantially the same as the configurations of the first to fourth gate electrode layers 812a, 812b, 812c and 812d and first to fifth interlayer insulation layers 813a, 813b, 813c, 813d and 813e of the first gate structure 810.

Referring to FIGS. 28A to 28C, the first to third gate insulation layers 920a, 920b and 920c may be disposed on the channel lower contact layer 805 to cover the sidewall surface S2 of the second gate structure 910. The first to third gate insulation layers 920a, 920b and 920c may be separated from each other with respect to the second direction (i.e., y-direction) by the first and second cell insulation structures 872 and 874. That is, the first to third gate insulation layers 920a, 920b and 920c may be spaced apart from each other with respect to the second direction (i.e., y-direction).

The first to third resistance change layers 930a, 930b and 930c and the first to third channel layers 940a, 940b and 940c may be disposed on the channel lower contact layer 805 to sequentially cover the first to third gate insulation layers 920a, 920b and 920c. The first to third resistance change layers 930a, 930b and 930c may be separated from each other with respect to the second direction (i.e., y-direction) by the first and second cell insulation structures 872 and 874. Similarly, the first to third channel layers 940a, 940b and 940c may be separated from each other with respect to the second direction (i.e., y-direction) by the first and second cell insulation structures 872 and 874.

The configurations of the first to third gate insulation layers 920a, 920b and 920c, the first to third resistance change layers 930a, 930b and 930c, and the first to third channel layers 940a, 940b and 940c may be substantially the same as the configurations of the first to third gate insulation layers 820a, 820b and 820c, the first to third resistance change layers 830a, 830b and 830c, and the first to third channel layers 840a, 840b and 840c of the first gate structure 810, respectively.

Referring to FIGS. 28A to 28C, first to third filling structures 850a, 850b and 850c may be disposed between the first to third channel layers 840a, 840b and 840c of the first gate structure 810 and the first to third channel layers 940a, 940b and 940c of the second gate structure 910, respectively. Each of the first to third filling structures 850a, 850b and 850c may include an insulating material. The insulating material may include, for example, oxide, nitride, oxynitride, or a combination of two or more thereof.

The first to third channel upper contact layers 860a, 860b and 860c may be disposed on the first to third filling structures 850a, 850b and 850c, respectively. The first to third channel upper contact layers 860a, 860b and 860c may be separated from each other by the first and second cell insulation structures 872 and 874. The first channel upper contact layer 860a may be disposed to contact the first channel layer 840a of the first gate structure 810 and the first channel layer 940a of the second gate structure 910. The second channel upper contact layer 860b may be disposed to contact the second channel layer 840b of the first gate structure 810 and the second channel layer 940b of the second gate structure 910. The third channel upper contact layer 860c may be disposed to contact the third channel layer 840c of the first gate structure 810 and the third channel layer 940c of the second gate structure 910.

The first and second cell insulation structures 872 and 874 may be disposed on the channel lower contact layer 805 to extend in the first direction (i.e., z-direction). The first and second cell insulation structures 872 and 874 may be disposed to contact the first and second gate structures 810 and 910, respectively, in the third direction (i.e., x-direction). Each of the first and second cell insulation structures 872 and 874 may include an insulating material. The insulating material may include, for example, oxide, nitride, oxynitride, or a combination of two or more thereof.

Referring to FIG. 28A again, the nonvolatile memory device 8 may include first to sixth memory element units U81, U82, U83, U84, U85 and U86 which perform operations independently of each other. The first memory element unit U81 may include the portions of the first gate structure 810, the first gate insulation layer 820a, the first resistance change layer 830a, the first channel layer 840a and the first channel upper contact layer 860a. The second memory element unit U82 may include portions of the first gate structure 810, the second gate insulation layer 820b, the second resistance change layer 830b, the second channel layer 840b and the second channel upper contact layer 860b. The third memory element unit U83 may include portions of the first gate structure 810, the third gate insulation layer 820c, the third resistance change layer 830c, the third channel layer 840c and the third channel upper contact layer 860c. The fourth memory element unit U84 may include portions of the second gate structure 910, the first gate insulation layer 920a, the first resistance change layer 930a, the first channel layer 940a and the first channel upper contact layer 860a. The fifth memory element unit U85 may include portions of the second gate structure 910, the second gate insulation layer 920b, the second resistance change layer 930b, the second channel layer 940b and the second channel upper contact layer 860b. The sixth memory element unit U86 may include portions of the second gate structure 910, the third gate insulation layer 920c, the third resistance change layer 930c, the third channel layer 940c and the third channel upper contact layer 860c. The first to sixth memory element units U81, U82, U83, U84, U85 and U86 may share the channel lower contact layer 805. In addition, the first and fourth memory element units U81 and U84 may share the first channel upper contact layer 860a, the second and fifth memory element units U82 and U85 may share the second channel upper contact layer 860b, and the third and sixth memory element units U83 and U86 may share the third channel upper contact layer 860c.

The operation method of the first to sixth memory element units U81, U82, U83, U84, U85 and U86 may be substantially the same as operation methods of the nonvolatile memory device 7 described above in connection with FIGS. 22A and 22B. As an example, the circuit diagram of any one of the first to sixth memory element units U81, U82, U83, U84, U85 and U86 may be substantially the same as the circuit diagram of FIG. 23. In addition, the set operation and the reset operation of any one of the first to sixth memory element units U81, U82, U83, U84, U85 and U86 may be substantially the same as the set operation and the reset operation of the nonvolatile memory device 7 described above in connection with FIGS. 24 and 27.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A nonvolatile memory device comprising:
   a substrate;
   a resistance change layer disposed on the substrate;
   a gate electrode layer disposed on the resistance change layer; and
   a first electrode pattern layer and a second electrode pattern layer that are disposed in the substrate and contact different portions of the resistance change layer,
   wherein the resistance change layer comprises movable oxygen vacancies or movable metal ions,
   wherein the substrate comprises a semiconductor material,
   wherein the semiconductor material contacts the resistance change layer,
   wherein the resistance change layer has a first resistive material layer disposed on upper surfaces of the first electrode pattern layer, the substrate and the second electrode pattern layer and a second resistive material layer disposed on the first resistive material layer,
   wherein a thickness of the first resistive material layer is less than a thickness of the second resistive material layer,
   wherein the first resistive material layer has a lower concentration of oxygen vacancies or a lower concentration of movable metal ions compared with the second resistive material layer, and wherein the nonvolatile memory device further comprises:

first and second trigger filaments formed in the first resistive material layer adjacent to pattern edge portions of the first and second electrode pattern layers, the first and second trigger filaments contacting the first and second electrode pattern layers; and a connecting filament formed in the second resistive material layer, the connecting filament connecting the first and second trigger filaments, wherein the first and second trigger filaments are disposed through the first resistive material layer to reach the second resistive material layer to contact the connecting filament, wherein the first and second trigger filaments are not directly connected with each other, and wherein diameters of the first and second trigger filaments are greater than a diameter of the connecting filament.

2. The nonvolatile memory device of claim 1, wherein the gate electrode layer has a plurality of gate pattern layers spaced apart from each other.

3. The nonvolatile memory device of claim 1, wherein the semiconductor material comprises at least one selected from the group consisting of silicon (Si), germanium (Ge), gallium arsenic (GaAs), molybdenum selenide ($MoSe_2$), hafnium selenide ($HfSe_2$), indium selenide (InSe), gallium selenide (GaSe), black phosphorus, and indium-gallium-zinc oxide (IGZO).

4. The nonvolatile memory device of claim 3, wherein the substrate further comprises a channel formation region disposed between the first electrode pattern layer and the second electrode pattern layer.

5. The nonvolatile memory device of claim 1, further comprising a gate insulation layer disposed between the resistance change layer and the gate electrode layer.

6. The nonvolatile memory device of claim 1, wherein a resistivity of the first resistive material layer is higher than a resistivity of the second resistive material layer.

7. The nonvolatile memory device of claim 1, wherein the resistance change layer has a concentration of oxygen vacancies or a concentration of metal ions which increases from a first interface between the resistance change layer and the substrate to a second interface between the resistance change layer and the gate electrode layer.

* * * * *